US00RE34893E

United States Patent [19]

Fujii et al.

[11] E Patent Number: Re. 34,893

[45] Reissued Date of Patent: Apr. 4, 1995

[54] SEMICONDUCTOR PRESSURE SENSOR AND METHOD OF MANUFACTURING SAME

[75] Inventors: Tetsuo Fujii, Toyohashi; Yoshitaka Gotoh, Ichinomiya; Susumu Kuroyanagi; Osamu Ina, both of Anjo, all of Japan

[73] Assignee: Nippondenso Co., Ltd., Kariya, Japan

[21] Appl. No.: 35,248

[22] Filed: Mar. 22, 1993

Related U.S. Patent Documents

Reissue of:

[64] Patent No.: 5,095,349
Issued: Mar. 10, 1992
Appl. No.: 363,526
Filed: Jun. 7, 1989

[30] Foreign Application Priority Data

| | | | |
|---|---|---|---|
| Jun. 8, 1988 | [JP] | Japan | 63-140676 |
| Nov. 1, 1988 | [JP] | Japan | 63-277119 |
| Dec. 1, 1988 | [JP] | Japan | 63-305061 |
| Apr. 17, 1989 | [JP] | Japan | 1-96872 |

[51] Int. Cl.[6] ..... H01L 29/84; H01L 29/96

[52] U.S. Cl. ..... 257/419; 257/254; 257/417; 257/418; 257/524; 257/619; 257/622; 257/701

[58] Field of Search ..... 257/254, 417, 418, 419, 257/524, 619, 622, 701

[56] References Cited

U.S. PATENT DOCUMENTS

| | | | |
|---|---|---|---|
| 3,941,629 | 3/1976 | Jaffe | 357/26 |
| 4,314,225 | 2/1982 | Tominaga et al. | 357/26 |
| 4,672,354 | 6/1987 | Kurtz et al. | 357/26 |
| 4,839,708 | 6/1989 | Kano et al. | 357/26 |

FOREIGN PATENT DOCUMENTS

| | | |
|---|---|---|
| 2429894 | 1/1975 | Germany . |
| 5936434 | 6/1977 | Japan . |
| 0042968 | 3/1986 | Japan . |
| 61-239675 | 10/1986 | Japan . |
| 62-18072 | 1/1987 | Japan . |
| 62-268167 | 11/1987 | Japan . |

OTHER PUBLICATIONS

Transducers '87, "Ion Sensitive FET with a silicon-insulator Silicon Structure", (pp. 711–714).

IEEE Transactions on Electron Devices, "Integrated Signal Conditioning for Silicon Pressure Sensors", vol. ED-26, No. 12, Dec. 1979, (pp. 1906–1910).

*Primary Examiner*—Ngan V. Ngo

*Attorney, Agent, or Firm*—Cushman, Darby & Cushman

[57] ABSTRACT

A semiconductor pressure sensor of this invention is intended to provide a semiconductor pressure sensor having an excellent electrical isolation between the supporting means of the semiconductor pressure sensor and the semiconductor substrate, the semiconductor pressure sensor basically comprising a semiconductor substrate having a first semiconductor region in which at least a semiconductor device is formed, a second semiconductor region and an isolated layer buried between the first and second semiconductor regions, a cavity provided in the second semiconductor region, the opening thereof existing on the main surface of the second semiconductor region and a strain detecting portion consisting of the semiconductor device and provided in the first semiconductor region opposite to the cavity. The semiconductor pressure sensor is featured in that at least one of the outer peripheral side surfaces of the first and the second semiconductor regions is formed inside of the outermost peripheral side surface of the isolation layer.

22 Claims, 21 Drawing Sheets

SEMICONDUCTOR PRESSURE SENSOR AND METHOD OF MANUFACTURING SAME

Matter enclosed in heavy brackets [ ] appears in the original patent but forms no part of this reissue specification; matter printed in italics indicates the additions made by reissue.

BACKGROUND OF THE INVENTION

1. Field of the Invention

This invention relates to a semiconductor pressure sensor which is substantially impervious to electrical interference.

2. Description of the Related Art

A semiconductor pressure sensor for measuring a pressure by detecting a variation of resistance value caused by a deformation of a strain guage is well known, and usually comprises a diaphragm made of a single crystal silicon substrate and having a thin portion. The variations of resistance are measured by detecting the value of a pressure applied to the diaphragm, utilizing the concept that the deformation of the strain guage varies in accordance with a mechanical strain force applied thereto by a piezo-resistance element.

Japanese Unexamined Patent Publication 61-239675 discloses a semiconductor pressure sensor, as shown in FIG. 22, which comprises a semiconductor substrate 800 on which a piezoresistance layer 802 is formed, a semiconductor substrate layer 810 for supporting the semiconductor pressure sensor, and a buried isolation layer 808 provided between the semiconductor substrate 800 and the semiconductor substrate layer 810. This sensor is characterized in that a bimetallic movement caused by contact between the diaphragm having a thin thickness and another isolation layer formed on the surface thereof, is suppressed.

As shown in FIG. 22, a conductive metal layer 804 and an isolation layer 806 are further provided in the semiconductor pressure sensor.

In the semiconductor pressure sensor as shown in FIG. 22, however, several drawbacks have been found, for example, the semiconductor substrate 800 and the semiconductor substrate layer 810 are inter conductive when they come into contact with each other during a dicing operation for separating a wafer into respective chips, because the thickness of the buried isolation layer 808 provided therebetween is very thin, e.g., about 0.5 to 2 μm, or when water or dust is attached to an outer peripheral side surface of the buried isolation layer 808 or in the vicinity thereof, even after the semiconductor pressure sensor is produced. Further, when an electrical voltage exceeding a surface discharge breakdown voltages is applied, due to noise or the like, between the semiconductor substrate 800 and the semiconductor substrate layer 810, an external potential will be introduced into the semiconductor substrate, leading to a malfunction or variations in the output thereof due to a mutual interaction between the substrate and the circuitry of a chip pressure sensor on which a drive source of the semiconductor pressure sensor and various circuits are integrated.

SUMMARY OF THE INVENTION

In view of the drawbacks of the conventional semiconductor pressure sensor, the object of this invention is to provide a semiconductor pressure sensor wherein the supporting means of the semiconductor pressure sensor is completely electrically isolated from the semiconductor substrate.

Therefore, according to the present invention, there is provided a semiconductor pressure sensor which comprises a semiconductor substrate having a first semiconductor region in which a semiconductor device is formed, a second semiconductor region, a buried isolation layer provided between the first and the second semiconductor regions, a cavity provided in the second semiconductor region and opening onto the main surface of the second semiconductor region, and a strain detecting portion consisting of the semiconductor device provided in the first semiconductor region opposite to the cavity. The semiconductor pressure sensor is further characterized in that at least one of the outer peripheral side surfaces of the first and the second semiconductor regions is located inward of the outermost peripheral side surface of the isolation layer.

Further, in accordance with the present invention, there is provided a method of manufacturing a semiconductor pressure sensor, which comprises the steps of bringing a first semiconductor substrate and a second semiconductor substrate in contact with an isolation layer formed therebetween on the surface of one of these semiconductor substrates, etching the main surface of the first semiconductor substrate to thin the thickness thereof, forming at least a semiconductor device in the first semiconductor substrate, forming a cavity extending into the second semiconductor substrate from the main surface thereof, forming a strain detecting portion in the first semiconductor substrate opposite to the cavity, and etching at least one of the outer peripheral side surfaces of the first and second semiconductor substrate to provide a predetermined distance between that outer peripheral side surface and a peripheral side surface of the isolation layer.

According to the present invention, to realize the object thereof as explained above, the characteristic feature of the semiconductor pressure sensor is such that at least one of the outer peripheral side surfaces of the first semiconductor region and the second semiconductor region is located inward of the outer peripheral side surfaces of the isolation layer provided therebetween.

Namely, at least one of the outer peripheral side surfaces of the first semiconductor region or the second semiconductor region is formed at a predetermined distance T inward from the outer peripheral side surface of the isolation layer, e.g., the outer peripheral side surface of the second semiconductor region is formed on the inner portion of the isolation layer at a distance T from the outer peripheral side surface of the isolation layer.

Accordingly, the distance between an end portion of one of the outer peripheral side surfaces of, for example, the first semiconductor region, and that of the second semiconductor region can be greater than the thickness of the isolation layer, whereby an undesirable conduction between the first semiconductor region and the second semiconductor region is effectively prevented during actual use.

DESCRIPTION OF THE PREFERRED EMBODIMENTS

The preferred embodiments of this invention will be described with reference to the attached drawings hereunder.

Figure 1A:
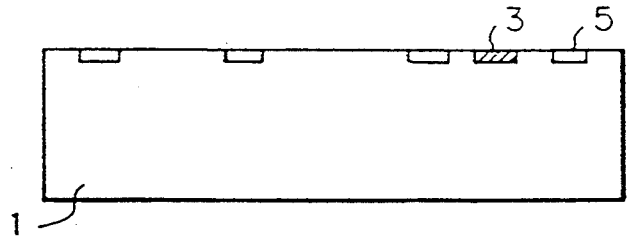
FIGS. 1(a) to 1(h) are cross sectional views of the process of manufacturing the semiconductor pressure sensor of the first embodiment of the present invention.

FIGS. 1(a) to 1(h) are the cross sectional views of the process of manufacturing the semiconductor pressure sensor of the first embodiment of the present invention. The process steps involved will be explained sequentially as follows. As shown in FIG. 1(a), and $n^+$ buried layer 3 and a $p^+$ buried layer 5 are provided on the surface of a semiconductor substrate 1, by an ion implanting method.

Figure 1B:
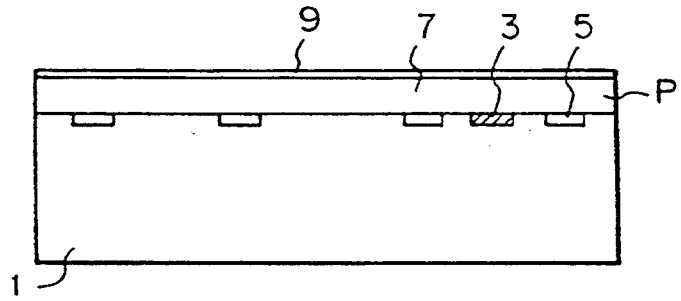

Then, as shown in FIG. 1(b), a p-type epitaxial layer 7 having a resistance of 10 to 20 Ωcm is grown to a predetermined thickness of, for example 5 to 30 μm (the thickness thereof is determined in accordance with the pressure to be applied to the semiconductor pressure sensor), and an isolation layer 9 of $SiO_2$ and having a thickness of about 0.5 μm is formed on the layer 7 by a thermal oxidation method.

Figure 1C:
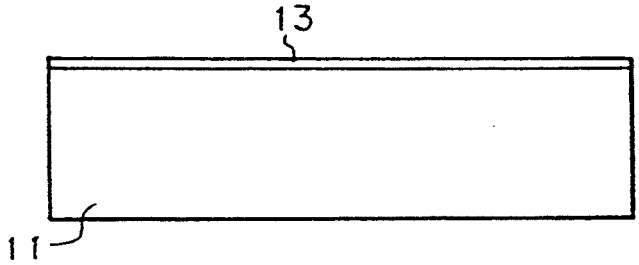
Figure 1D:
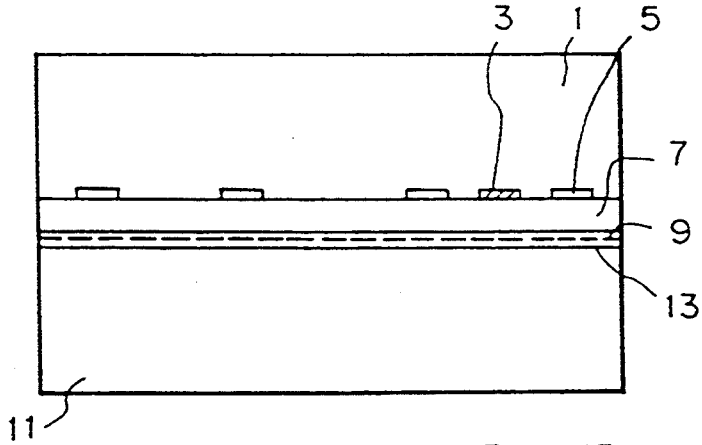

As shown in FIG. 1(c), an isolation layer 33 of $SiO_2$ and having a thickness of about 0.5 μm is formed on an n-type silicon semiconductor substrate 11 by the thermal oxidation method, and thereafter, as shown in FIG. 1(d), the wafers shown in FIGS. 1(b), and 1(c), are placed in contact with each other with the isolation layer 9 and isolation layer 13 facing each other, and the wafers are bonded together at a bonding temperature of 800° C. to 100° C.

Figure 1E:
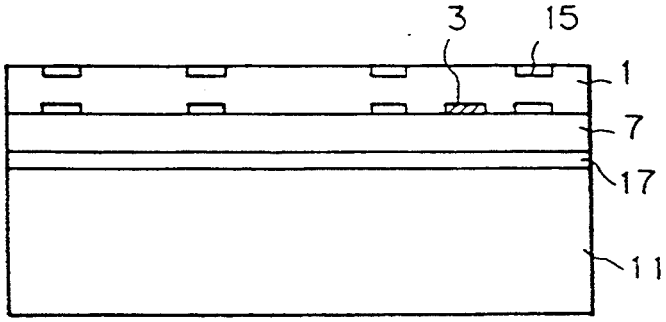

Next, as shown in FIG. 1 1(e), the n-type semiconductor substrate is ground by a lapping process, to produce a mirror finish on the surface thereof, and the $p^+$ isolation diffusing layers 15 are formed in the regions of the surface the substrate 1 at which the isolation portions will be later formed.

Hereinafter the contacting portion between the substrates consisting of the isolation layer 9 and 13, is given the reference numeral 17.

Figure 1F:
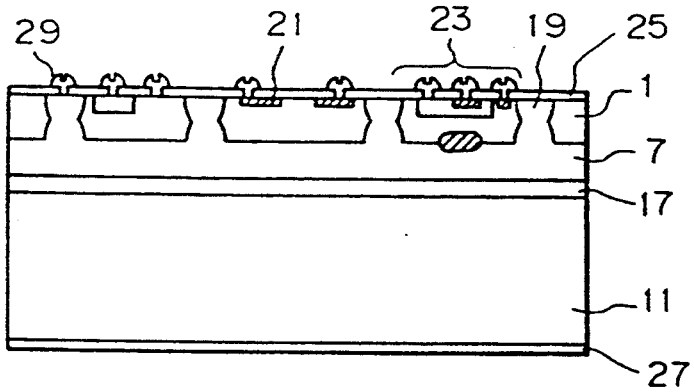

Then, as shown in FIG. 1(f), $p^+$ isolation diffusing layers 19 are formed in the silicon semiconductor substrate 1 by a thermal treatment, and thereafter piezo resistance layers 21, which serve as strain detecting portions, are formed on a predetermined region of the surface of the n-type silicon semiconductor substrate 1 by diffusing p-type impurities such as boron (B) or the like, utilizing the silicon oxide film as a mask a semiconductor means formed by a bipolar transistor 23 is then formed thereon, and isolation layers 25 and 27 and an Al wiring layer 29 are formed by a conventional planar method.

Figure 1G:
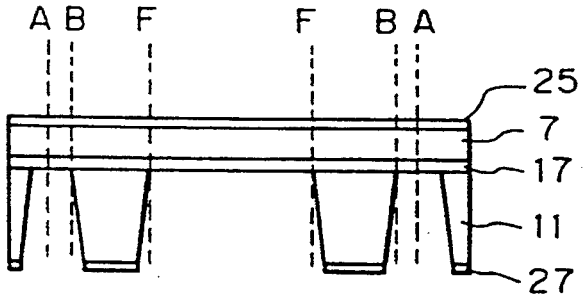

FIG. 1(g) is a schematic cross sectional view of an essential feature of this embodiment.

First, predetermined pressurized medium introducing portions of the n-type silicon semiconductor substrate 11, for example a region indicated as F-F and having a distance of 1 mm to 5 mm and a region indicated as A-B and having a distance of 5 μm, are etched by a caustic etching method utilizing a caustic potash KOH, or a mixed etchant of hydrogen fluoride, nitric acid, and acetic acid, using the $SiO_2$ insulated layer 27 as a mask and the $SiO_2$ insulated layer 17 as a stopper.

Figure 1H:
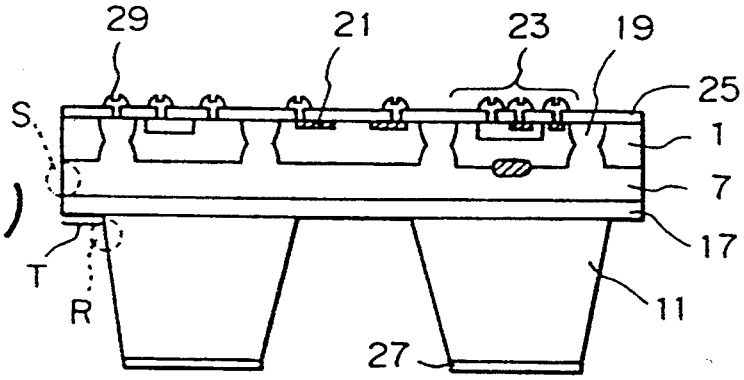

A semiconductor pressure sensor as shown in FIG. 1(h) is obtained by cutting the wafer as shown in FIG. 1(g) at the dotted line A, with a mechanical cutter. In this embodiment, the distance T of the chip after the cutting operation, as shown in FIG. 1(h), is about 5 82 m, In this embodiment of the semicondcutor pressure sensor as shown in FIG. 1(h), the outer peripheral side surface S of the p-type epitaxial layer 7 and the outer peripheral side surface R of the n-type silicon semiconductor substrate 11 will not come into contact with each other, since the outermost portion of the n-type silicon semiconductor substrate 11 is spaced from the outer peripheral side surface of the $SiO_2$ isolation layer 17 at the predetermined distance T of, for example, about 5 μm. Further, in this embodiment, the distance from the outer peripheral side surface of the n-type silicon semiconductor substrate 1 to the outer peripheral side surface R of the n-type silicon semiconductor substrate 11 can be made greater than the thickness of the isolation layer 17, and thus the possibility of conduction between the silicon semiconductor substrates 1 and 11 is minimized even when water, dust, or the like is attached to the outer peripheral side surface of the isolation layer 17.

Figure 5:
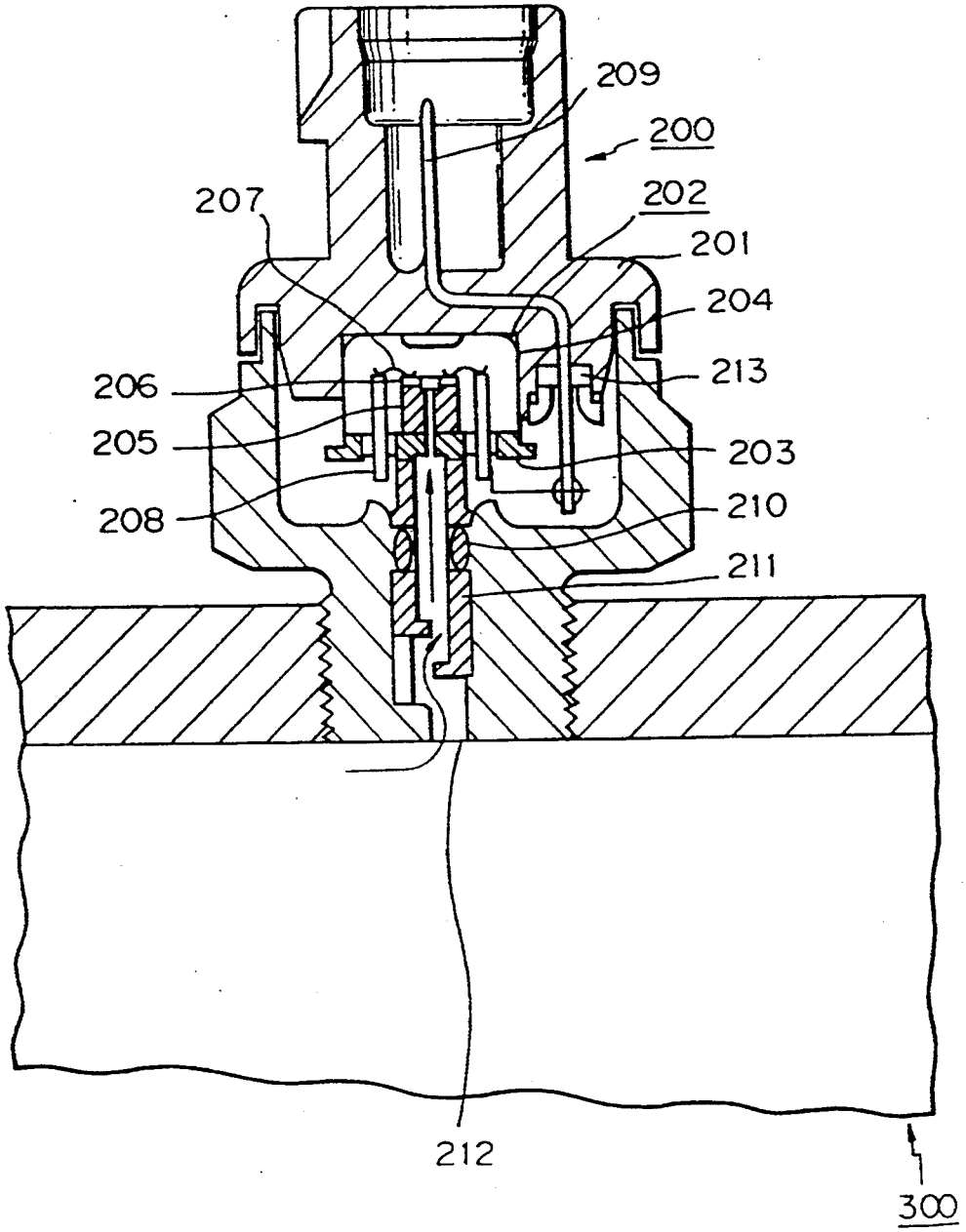
FIG. 5 is a cross sectional view showing the construction of the semiconductor pressure sensor of the present invention.

The semiconductor pressure sensor as shown in FIG. 1(h) is applied to a device 200 shown in FIG. 5. When this device 200 is directly mounted on a surge tank 300 or the like of an automobile, for detecting an intake air pressure therein, foreign particles such as moisture, dust or the like introduced into the surge tank 300 will be fed into the device 200, as shown by an arrow in FIG. 5, and when arriving at the semiconductor substrate 11 of the semiconductor pressure sensor, in a form of a dew drop, an unstable body-earth level will be produced.

Nevertheless, when the semiconductor pressure sensor of this embodiment is applied, the air pressure can be still detected with a high accuracy even under the above conditions, because the electric potential of the substrate 11 can not affect the electric potential of the substrate 1.

As shown in FIG. 5, a pressure sensor unit 202 is contained in a housing 201 and is provided with a package consisting of a stem 203 and a cap 204 welded together and a glass base 205, and the semiconductor pressure sensor 206 shown in FIG. 1(h) is provided in the package.

In the package, a lead wire 208 is hermetically sealed and connected to a wire 207, which is connected to the semiconductor pressure sensor 206 to transfer the electric signal output from the semicondcutor pressure sensor 206 to the outside. The lead wire 208 is connected to the outside through a lead 209.

Further, in this unit 202, an O-ring 210 for sealing, a pressurized substance introducing pipe 211 having an end portion bent inward to prevent foreign particles introduced therein from entering with a pressurized substance 212, which is rapidly transferred to the semiconductor pressure sensor 206, and a feedthrough capacitor are provided.

Although an n-type silicon semiconductor substrate 11 is used in this embodiment, a p-type silicon semiconductor substrate may be used instead.

Figure 1I:
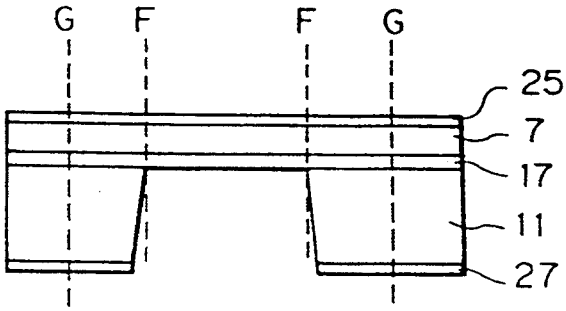
FIG. 1(i) is a cross sectional view showing a modification of the first embodiment of the present invention.

In this embodiment, the wafer is cut into chips along the dotted line A as shown in FIG. 1(g), but the wafer may be cut along the dotted line G as shown in FIG. 1(i), and thereafter, the side surfaces of the cup chip may be etched with a caustic etchant such as KOH or the like, after providing a wax and a ceramic plate on the surface of the isolation layer 25, so that the outer peripheral side surfaces of the silicon layers 7 and 11 will be arranged inward of the outer peripheral side surface of the isolated layer 17.

In this operation, the etching of the diaphragm portion may be stopped before the bottom portion of the cavity reaches the $SiO_2$ isolation layer 17 serving as a stopper, and thereafter, the etching of the side portion thereof may be carried out in the same manner as explained above.

Further, in this embodiment, the piezoresistance layer is formed by diffusing impurities into a single crystal silicon substrate, but a piezo resistance layer made of polycrystalline silicon may be formed on the surface of the $SiO_2$ layer when a high resistance is required.

Furthermore, the circuitry of this invention may be formed not only as a bipolar device but also as a MOS transistor or similar device.

Also, in this embodiment, the predetermined distance T is set to at least 2 μm, but it can preferably be set within a range of from 3 to 200 μm.

The semiconductor device used in this invention corresponds to the piezoresistance layer 21 and a bioplar transistor 23.

The second embodiment of this invention will be explained hereunder with reference to FIGS. 2(a) to 2(h).

Figure 2A:
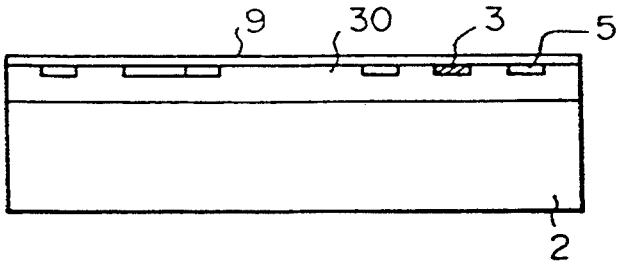
FIGS. 2(a) to 2(h) are the cross sectional views of the process of manufacturing the semiconductor pressure sensor of the second embodiment of the present invention.

FIGS. 2(a) to 2(h) are cross sectional views of the process of manufacturing the semiconductor pressure sensor of the second embodiment of the present invention. The process steps thereof will be explained sequentially as follows, as shown in FIG. 2(a), an n-type epitaxial layer 30 is epitaxially grown to a thickness of 10 to 15 μm, and having a resistance of 1 to 10 Ωcm, on the surface of the $n^+$ silicon semiconductor substrate 2, an $n^+$ type buried layer 3 and a $p^+$ type buried layer 5 are then formed by an ion implanting method, and thereafter, an isolation layer 9 of $SiO_2$ is formed thereon to a thickness of about 0.5 μm by a thermal oxidation method.

Figure 2B:
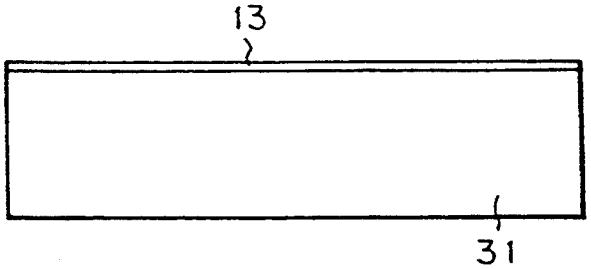

As shown in FIG. 2(b), an isolation layer 13 of $SiO_2$ having a thickness of about 0.5 μm is formed on a p-type silicon semiconductor substrate 31 by thermal oxidation.

Figure 2C:
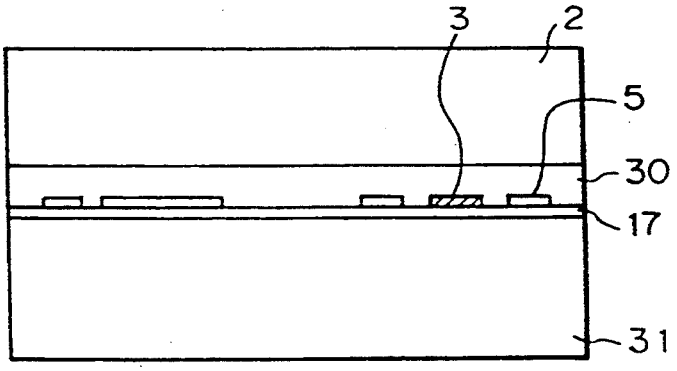

Thereafter, as shown in FIG. 2(c), the wafers shown in FIGS. 2(a) and 2(b), are brought with each other, with the isolation layers 9 and 13 thereof facing each other, by a direct wafer contact method at a temperature of 800° C. to 1100° C.

Next, the $n^+$ type semiconductor substrate 2 is ground by a lapping process to a thickness of about 30 μm, and thereafter, the $n^+$ type semiconductor substrate 2 is selectively etched by a mixed etchant containing hydrogen fluoride, nitric acid, and acetic acid at a mixing rate of 1:3:10, respectively, and diluted with wafer.

The surface is then given a mirror finish.

In this embodiment, the contacting portion consisting of the isolation layers 9 and 13 is given the reference numeral 17 hereafter.

Figure 2D:
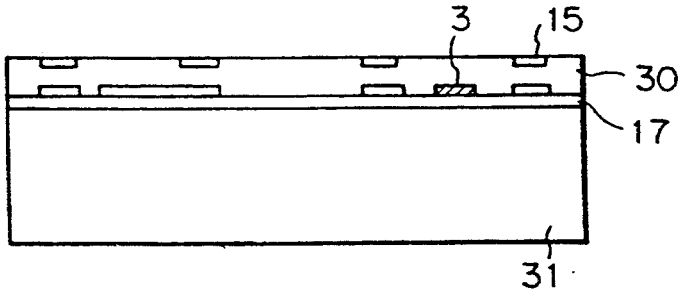
Figure 2E:
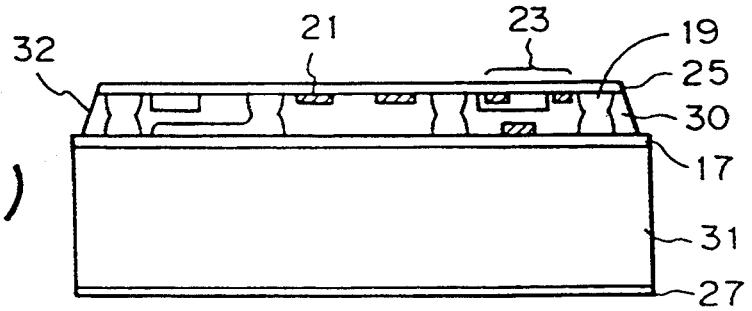

Next, as shown in FIG. 2(d), $p^+$ isolation diffusing layers 15 are formed in the regions of the surface in which the isolating portions will be later formed, and then as shown in FIG. 2(e), the $p^+$ isolation diffusing layers 19 are formed in the silicon semiconductor substrate 30 by a thermal treatment.

Figure 2F:
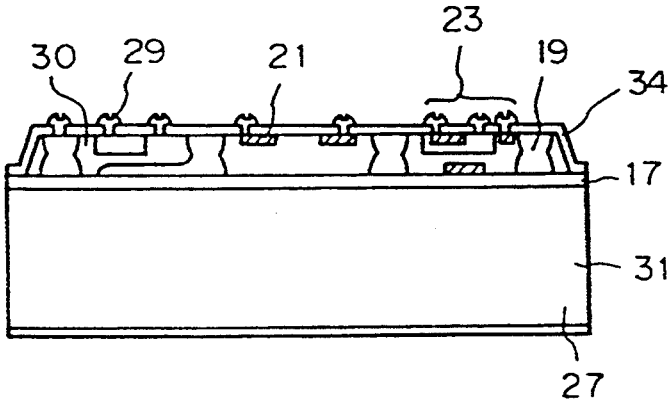
Figure 2G:
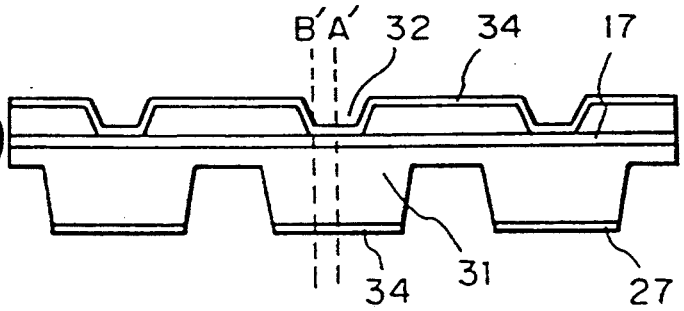

Then the piezoresistance layer 21, which serves as a strain detecting portion, is formed on a predetermined region of the surface of the n-type silicon semiconductor substrate 30, by diffusing P type impurities such as boron (B) or the like utilizing the silicon oxide film as a mask, and after a bipolar transistor 23 is formed thereon, a grooved portion which is a pressurized medium introducing portion 32 extending into the silicon semiconductor substrate 30 from the surface thereof is formed by a caustic etching method utilizing KOH and the isolation layer of $SiO_2$ as a mask, as shown in FIG. 2(g).

Figure 2H:
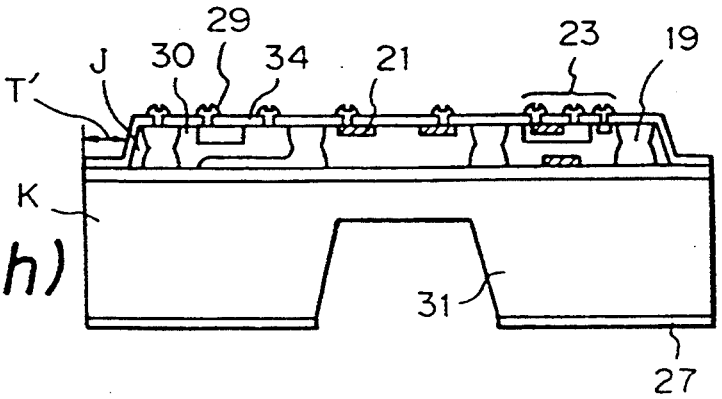

In this embodiment, the size of the grooved portion 32 is such that the distance T' of the semiconductor pressure sensor as shown in FIG. 2(h) is 5 μm.

Then an insulated layer 34 is formed on the surface of the grooved portion 32, as shown in FIG. 2(f), and a wiring 29 made of A1 is formed thereon to obtain a wafer as shown in FIG. 2(g).

Thereafter, the predetermined regions of the p-type silicon semiconductor substrate 31 are etched with a caustic etching method utilizing a caustic potash KOH and the $SiO_2$ insulated layer 27 as a mask, or a mixed etchant of hydrogen fluoride, nitric acid, and aceitc acid and utilizing the chromiun vapor film as a maks, and then the semiconductor pressure sensor as shown in FIG. 2(h) is obtained by cutting the wafer along the dotted line A'.

In this embodiment, the n-type silicon semiconductor substrate 30 is formed apart from the outer peripheral side surface of the isolation layer 17 at a predetermined distance T', and further, since the outer peripheral side surface J of the n-type silicon semiconductor substrate 30 is covered with the isolation layer 34, conduction between the outer peripheral side surfaces of the n-type silicon semiconductor substrate 30 and the p-type silicon semiconductor substrate 31 is substantially eliminated.

In a modification of this embodiment of the present invention, the isolation layer 34, an oxide film having a three-layer construction consisting of a nitride oxide film, an oxide film, and a nitride oxide film stacked in this order, each having a high dielectric constant, respectively, may be used instead of the oxide film 17, whereby the electric field is reduced and the electrical characteristic improved. Further, even when the sensor of the present invention is affected by noise or the like, the electrical interference between the substrate 30 and the substrate 31 is reduced.

Further, in this embodiment, as shown in FIG. 2(g), the etching of the p-type silicon semiconductor substrate 31 is stopped before the bottom of the grooved portion 32, *i.e., a pressurized medium introduced portion as shown in FIG. 1(g)*, reaches the isolation layer 17; alternatively the bottom [of the grooved portion 32] *thereof* can be allowed to reach the isolation layer 17.

Figure 3:
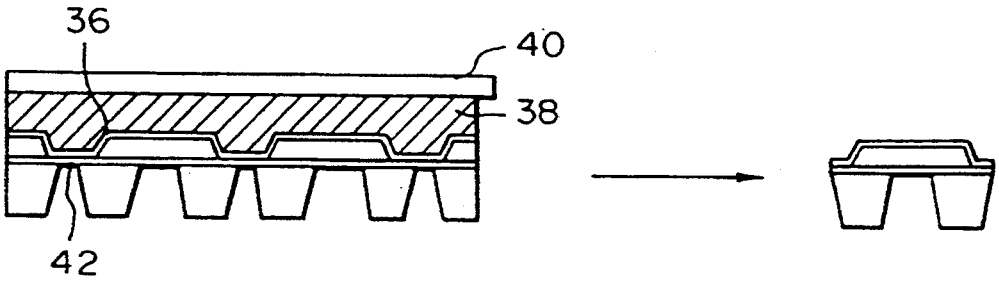
FIG. 3 is a cross sectional view of a semiconductor pressure sensor of the third embodiment of the present invention.

In this third embodiment, the wafer is cut by a mechanical cutting method such as scribing, wire sawing or the like although if the cutting is carried out after the wafer is completed, the method of etching the insulated layer 36 and 42 from the back side thereof while providing a wax 36 and a ceramic plate 40 on the surface of the isolation layer 36, as shown in FIG. 3, may be used.

Figure 4:
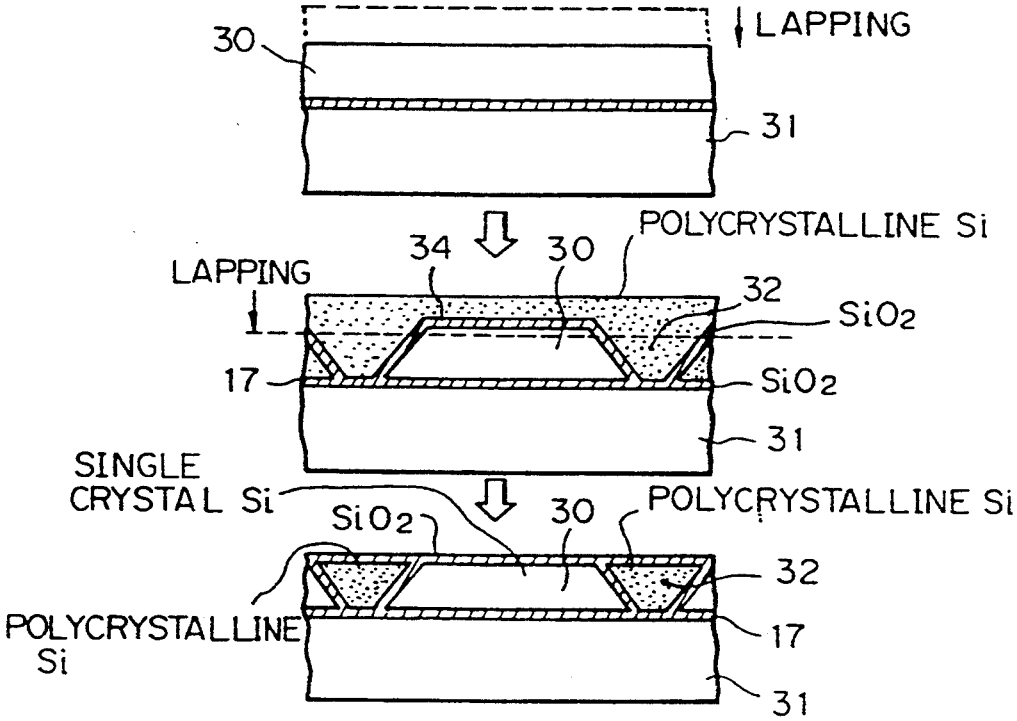
FIG. 4 is a cross sectional view showing a modification of the second embodiment of the present invention.

Further when the step shown in FIG. 4 is utilized, accumulation of the regist or the like in the grooved portion 32 is avoided because of the grooved portion 32 is buried in the polycrystalline silicon.

The fourth embodiment of this invention will be explained hereunder with reference to FIGS. 6(a) to 6(g).

Figure 6A:
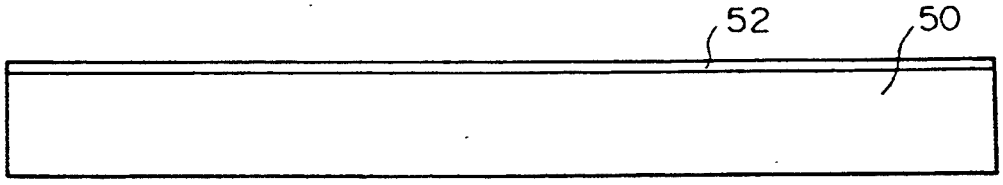
FIGS. 6(a) to 6(g) are the cross sectional views of the process of manufacturing the semiconductor pressure sensor of a fourth embodiment of the present invention.

In FIG. 6(a), an n-type silicon semiconductor substrate 50 having a crystal face (100) and a smooth surface is provided, and an oxide film of $SiO_2$ 52 having a thickness of 0.2–1 μm is formed on the surface thereof by wet oxidizing method, at a temperature of 1000° C.

Figure 6B:
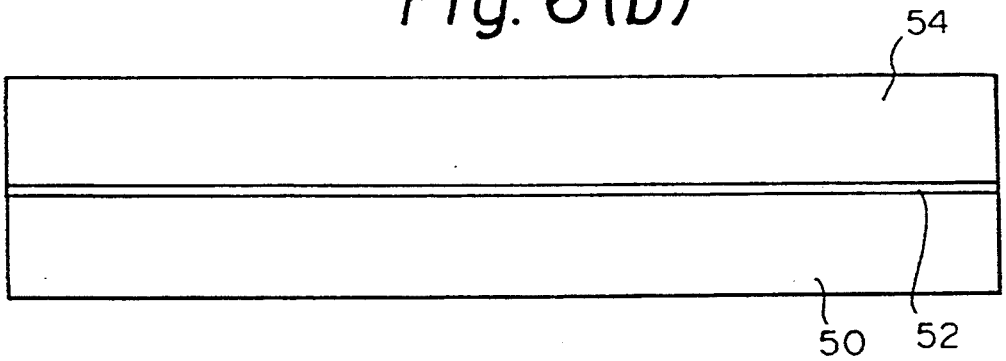

Then, as shown in FIG. 6(b), a p-type silicon semiconductor substrate 54 having a crystal face (100) and a resistance of 10 to 20 μcm is formed on the surface of the n-type silicon semiconductor substrate 50, by a wafer direct connection method, for example, in an nitrogen gas or an oxidizing atmosphere at a temperature of 1000° C. for a time of one hour.

Figure 6C:
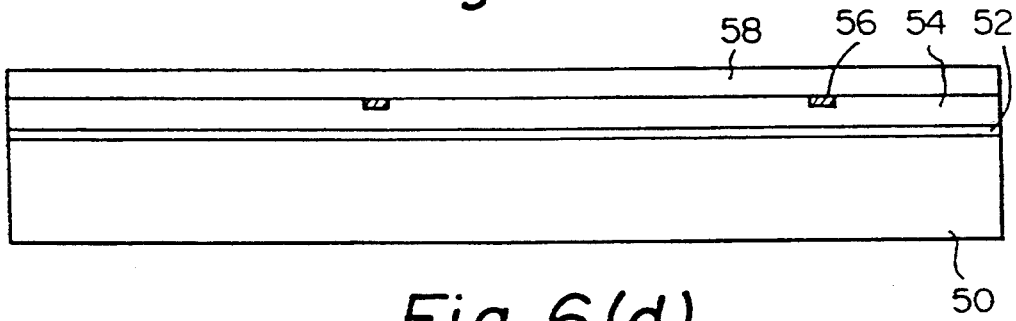

Then, as shown in FIG. 6(c), the p type silicons semiconductor substrate 54 is ground by lapping to a mirror finish until the thickness thereof is 5 to 100 μm, and thereafter, a buried layer 56 is formed theron by an ion implanting method, followed by forming an n-type epitaxial layer 58 thereon to a thickness of 5 to 15 μm.

Figure 6D:
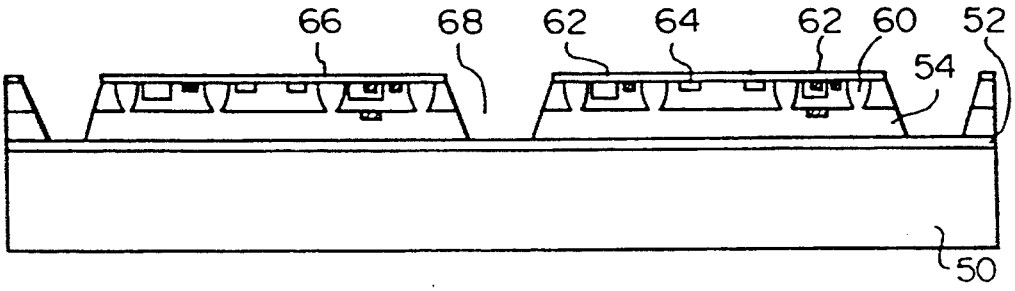
Figure 6:
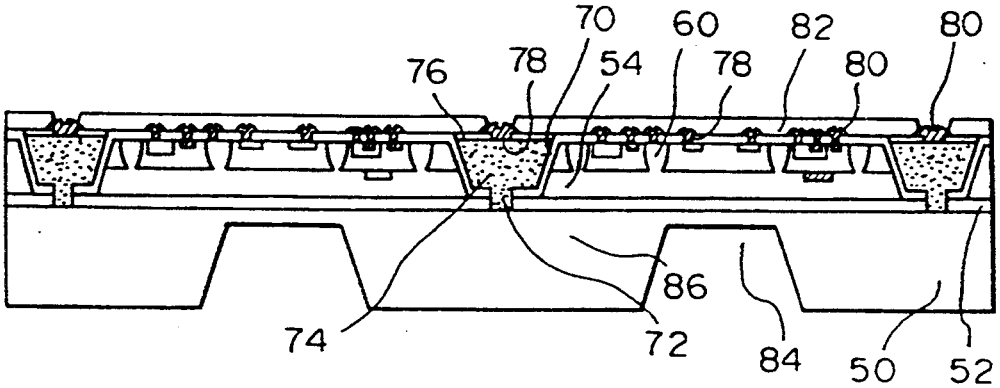
Figure 6:
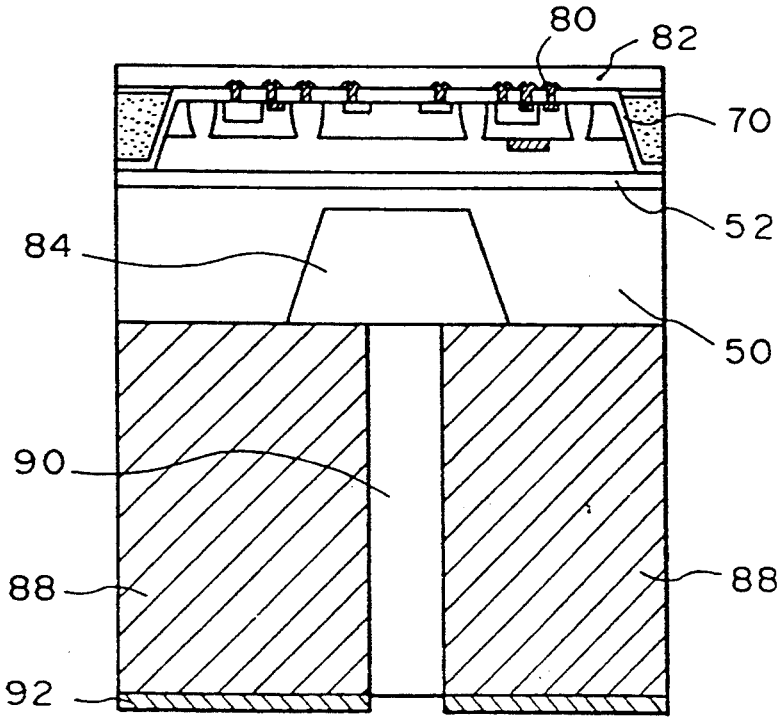

Next, as shown in FIG. 6(d), an isolation layer 60, various transistors 62, a diode and a resistor (both not shown), a p-type piezoresistance layer 64, and an oxide film 66 are formed, respectively, to provide devices utilizing a conventional method of making a bipolar IC or the like, and then a grooved portion 68 is formed in the region to be used as a scribe line, by an anisotrophy etching method using a caustic etchant such as KOH and the oxide film 66 as mask, in such a manner that the tip end portion of the groove reaches the oxide film 52.

Then, in the step shown in FIG. 6(e), after forming an $SiO_2$ film 70 by a thermal oxidation method of CVD method, an aperture 72 is formed in the region of the $SiO_2$ films 52 and 70, to be used as a scribe line, by an etching method (i.e., the region correspondings to a projected portion 86 in the silicon semiconductor substrate 50 described later).

Then the grooved portion 68 is filled with $n^+$ polycrystalline silicon 74 by a vacuum CVD method, under a reduced pressure, and the surface thereof is ground smooth.

Subsequently a thermal oxide film 76 is formed thereon, and successively, an aperture 78 is formed by a conventional IC process, followed by a wiring layer of Al 80 and a passivation film 82, and as a result, the Al wiring 80 is electrically connected to the silicon semiconductor substrate 50 through the polycrystalline silicon 74 and the aperture 72.

Further, a cavity 84 is formed by etching the region of the silicon semiconductor substrate 50 opposite to the region in which the diaphragm of the pressure sensors is provided, with a caustic etchant.

In this silicon semiconductor substrate 50, the portion without the cavity 84 is called a projecting portion 86.

Figure 6F:
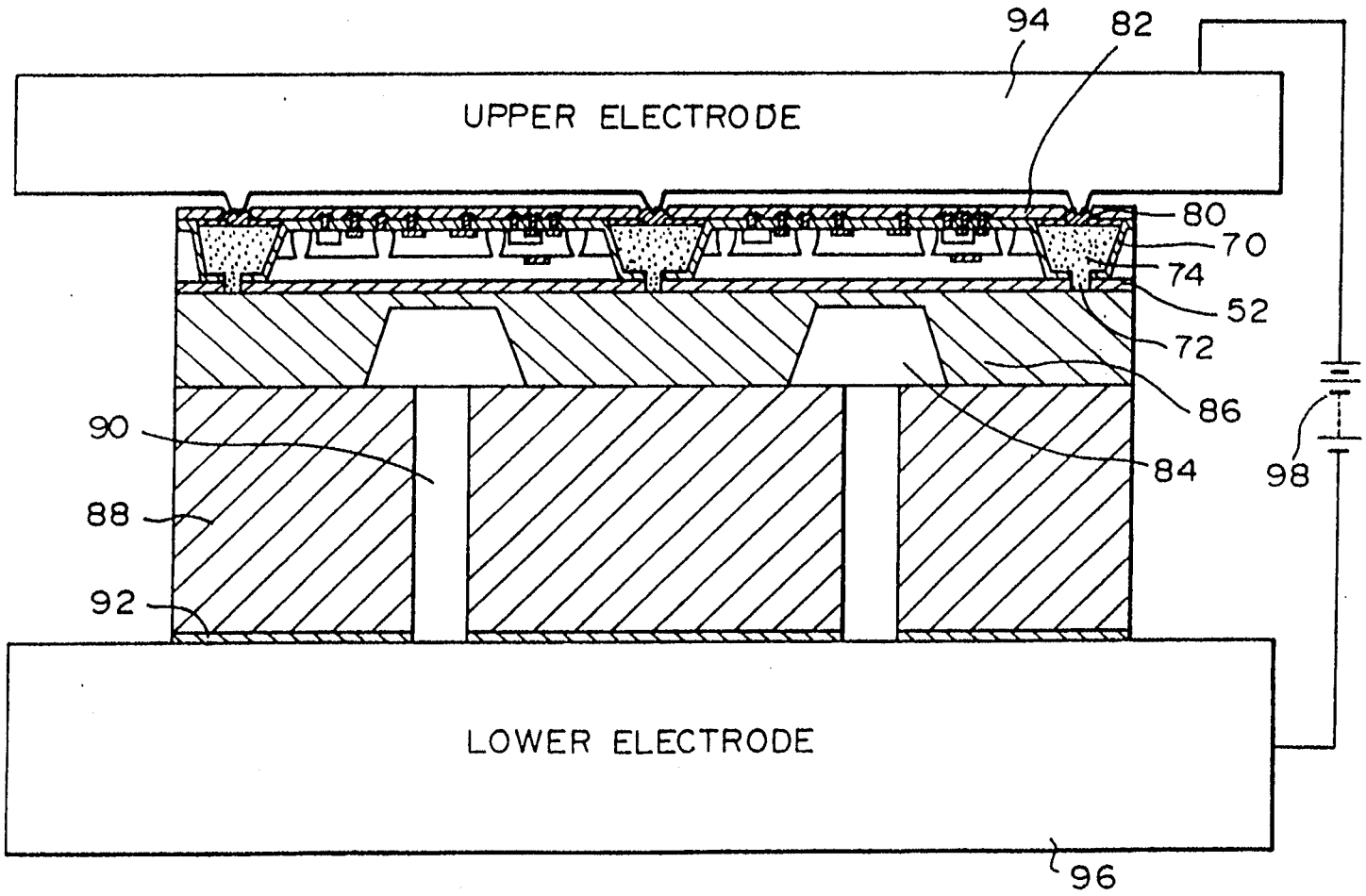

Then, as shown in FIG. 6(f), a glass plate 88 having the same thermal expansion coefficiecny as that of the silicon semiconductor substrate 50, for example, "PYLEX" (Trade Mark) glass, is provided for mounting the pressure sensor, and the sensor is connected to the base by an anodic bonding method. The glass plate 88 is provided with a pressure introducing hole 90 and an electrode layer 92, for stabilizing the connected portion.

The anodic bonding method as mentioned above, is carried out as follows.

The pressure sensor and the glass 88 are placed in contact with each other and the anodic bonding method is carried out by applying a voltage of 600–800 V thereto, utilizing one side of the sensor device on which a pressure sensor is provided as a positive electrode, for about 10 to 20 minutes at a temperature of 300° C. to 400° C. Then, as shown in FIG. 6(f), an upper electrode 94, a lower electrode 96, and an electric source 98 are provided.

After this process is completed, the device is cut at the portion of the Al wiring 80, the aperture 72, the projecting portion 86, and the glass portion 88, by a dicing saw, into a chip. The final product is shown in FIG. 6(g).

As a result of the above process, the Al wiring 80 and the aperture 72 formed on the scribe line are eliminated, and thus the electric isolation of the semiconductor substrate and the supporting means of the pressure sensor is completed, and further, the anodic bonding of the suporting means of the pressure sensor, i.e., the projecting portion 86 and the base 88, is easily carried out.

According to this embodiment, the following additional effects are obtained.

Namely, in this embodiment, the groove 68 is filled with the polycrystalline silicon 74 after the $SiO_2$ film 70 is formed on the inner surface of the groove portion 68, and thus substances such as resist or the like can be effectively prevented from entering the groove 68 during the forming of the Al wiring layer 80 after the $SiO_2$ film 70 is formed or the like, and the process as mentioned above can be carried out without error.

Figure 7:
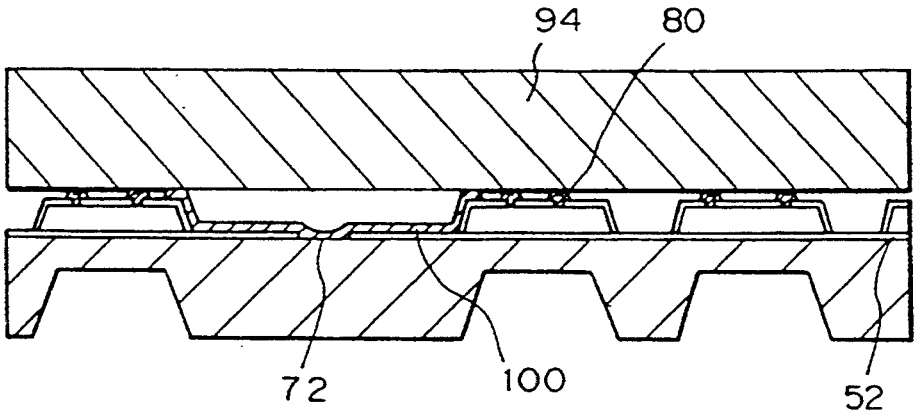
FIG. 7 is a cross sectional view showing a main portion of a first modification of the fourth embodiment of the present invention.

Next, the main portion of a modification of the fourth embodiment is shown in FIG. 7.

In this modification, the process steps upto the step of forming the aperture 72 are the same as in the fourth embodiment, and thereafter, an electrode 100 made of Al and used for the anodic bonding is formed inside the grooved portion, instead of filling the grooved portion with the polycrystalline silicon.

Figure 8:
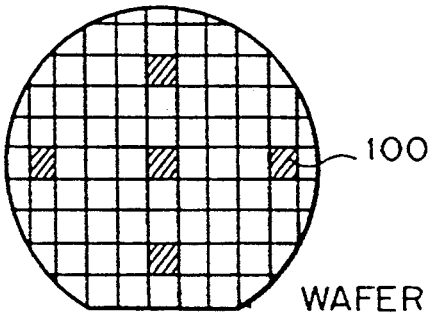
FIG. 8 is a plane view of the semiconductor pressure sensor shown in FIG. 7, as a wafer.

As shown in FIG. 8, the electrode 100 may be formed in several portions in a wafer, as shown by hatching to thereby a stable contact across the wafer.

Figure 9:
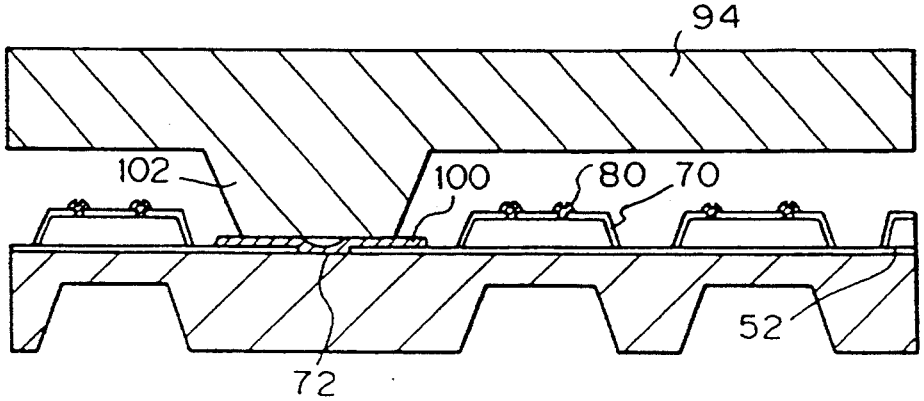
FIG. 9 is a cross sectional view showing a main portion of a second modification of the fourth embodiment of the present invention.

FIG. 9 shows a second modification of the fourth embodiment in which the electrode 100 for the anodic bonding is formed only on the surface of the insulated layer 52 and an upper portion of the aperture 72, and a more accurate electrical contact is obtained by providing the electrode 100 with a projecting portion 102.

Next, the fifth embodiment of the present invention will be explained with reference to FIGS. 10(a) to 10(h), and a modification thereof will be explained with reference to FIGS. 10(i) to 10(k).

Figure 10A:
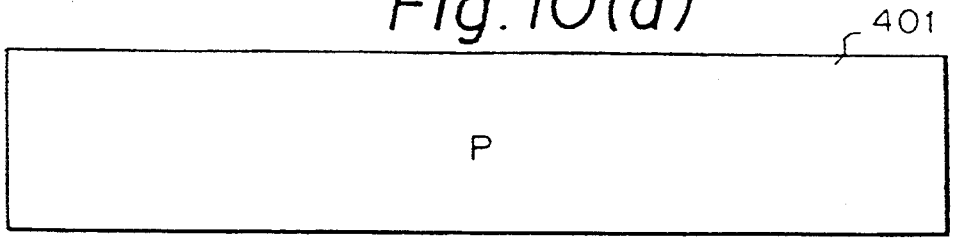
FIGS. 10(a) to 10(k) are cross sectional view of the process of manufacturing the semiconductor pressure sensor of a fifth embodiment of the present invention.
Figure 10B:
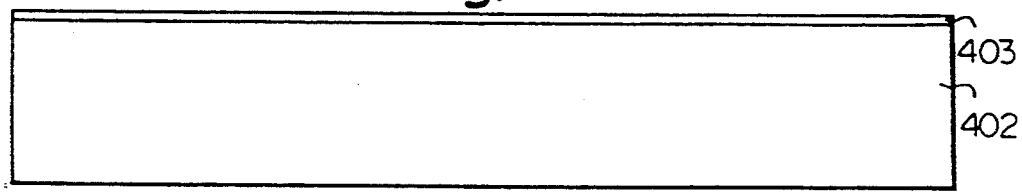
Figure 10C:
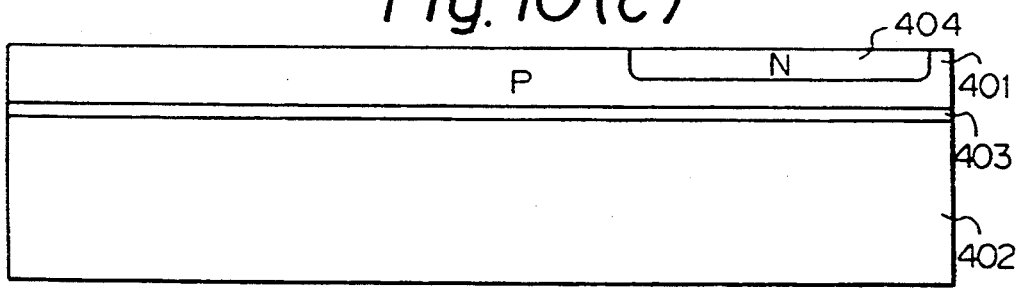

The steps shown in FIGS. 10(a) to 10(c) are the same as the steps shown in FIGS. 6(a) to 6(c), and 401 is a p-type silicon semiconductor subtrate, 402 is a p-type or n-type silicon semiconductor substrate, and 403 is an $SiO_2$ film having a thickness of 0.1 to 2 μm, respectively.

Further, as shown in FIG. 10(c), the n-well portion is formed by an ion implanting method after the semiconductor substrate 401 is formed to a thickness of 0.1 to 10 μm.

Figure 10D:
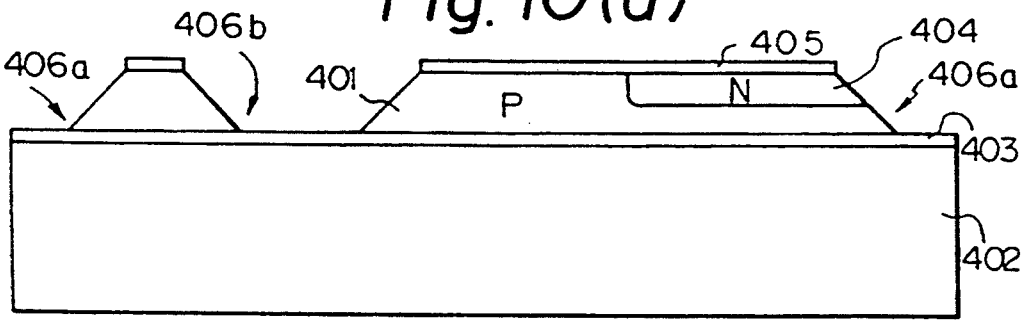

Then, as shown in FIG. 10(d), an $SiO_2$ film 405 having a thickness of 0.1 to 1 μm is formed on a predetermined region of the semiconductor substrate 402, and thereafter, a concaved portion 406b having a circular or rectangular shape and a groove 406a, are formed by etching with an etchant of a KOH solution using the $SiO_2$ film 405 as a mask, to give the side wall of the groove 406a and the concaved portion 406b, a tapered configuration.

At this time, the etching with the etchant of KOH solution is stopped when the bottoms of the groove 406a and the concaved portion 406b reach the surface of the $SiO_2$ film 403.

Figure 10E:
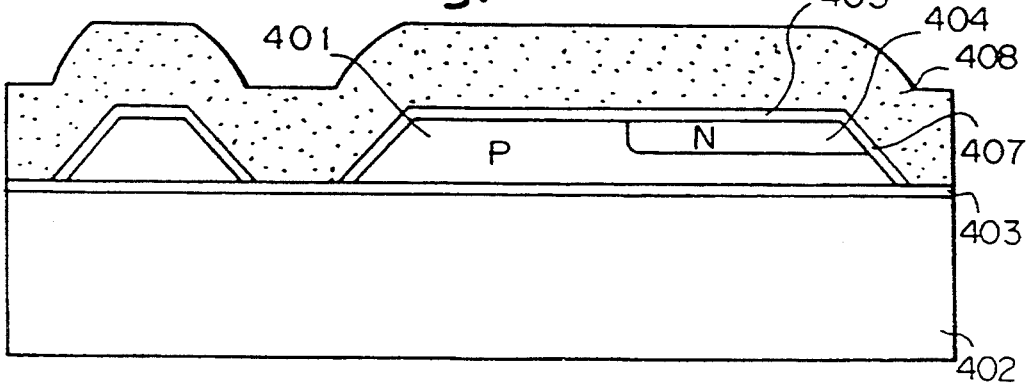

As shown in FIG. 10(e), after the thermal oxidation operation is carried out, an $SiO_2$ film 407 having a thickness of 0.1 to 1 μm is formed on the peripheral side surface of the semiconductor substrate 402, followed by the depositing of a polycrystalline silicon 408 over the whole surface of the substrate.

Figure 10F:
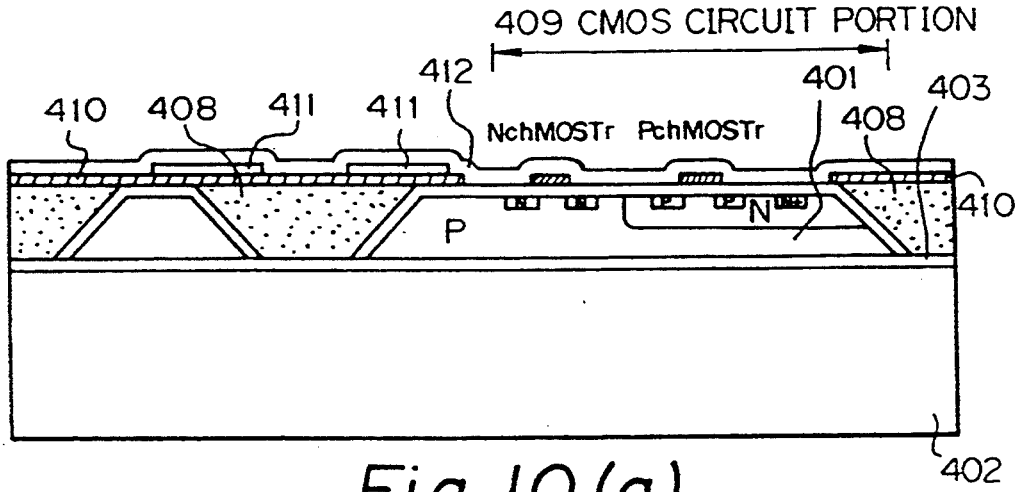

As shown in FIG. 10(f), a part of the polycrystalline silicon 408 is the removed by grinding, to make the surface thereof smooth, and successively, a circuitry 409 is formed on the $SiO_2$ film 403 by a conventional CMOS method utilizing a silicon (Si) gate, and in the region in which a pressure sensing means will be provided, a silicon nitride film 401 having the thickness of 0.1 to 1 μm is formed on the surface of the polycrystalline silicon layer 408, and further, a polycrystalline silicon layer having a thickness of 100 to 4000 Å and a predetermined concentration of impurities is formed on a predetermined region of the silicon nitride film 410, to form a piezoresistance layer 411.

Note that, when a recrystallizing operation is applied to the piezoresistance layer 411 utilizing a laser beam or the like, the sensitivity thereof will be improved.

In this embodiment, the polycrystalline silicon as an Si gate of CMOS and the piezoresistance layer 411 are formed separately, but they may be formed of the same polycrystalline silicon.

Thereafter, an layer insulating film such as a BPSG film (not show) and a wiring layer such as Al wiring or the like (not shown) are formed in the CMOS circuit portion, and a plasma nitride passivation film 412 is then formed thereover.

Figure 10G:
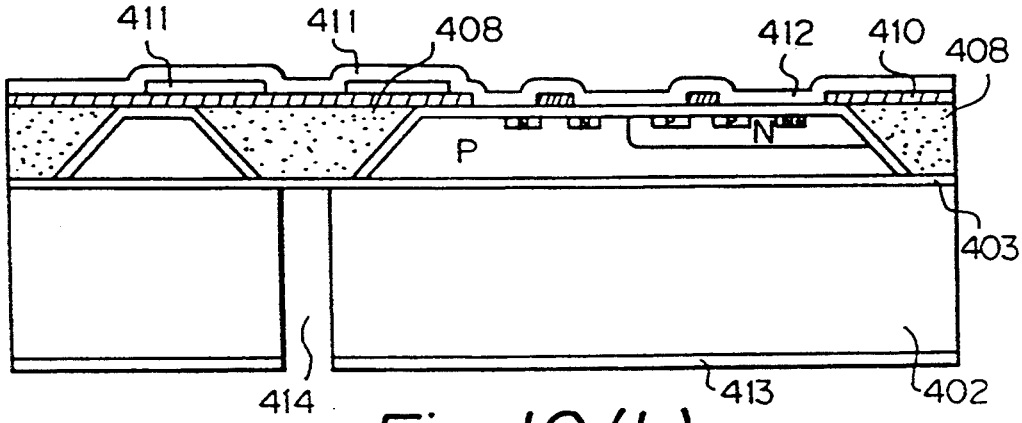

Next, as shown in FIG. 10(g), a plasma nitride passivation film 413 is formed on a predetermined region of the back surface of the silicon substrate 402 and is etched by a KOH solution, and at this time, the etching is stopped when the tip end portion of the aperture reaches the surface of the $SiO_2$ film 403.

Utilizing the anisotropic etching with a KOH solution or the like, when a specific pattern is to be etched, an aperture 414 having an axis perpendicular to the surface of the substrate can be obtained by forming an aperture in the substrate first by a laser and then by etching.

Figure 10H:
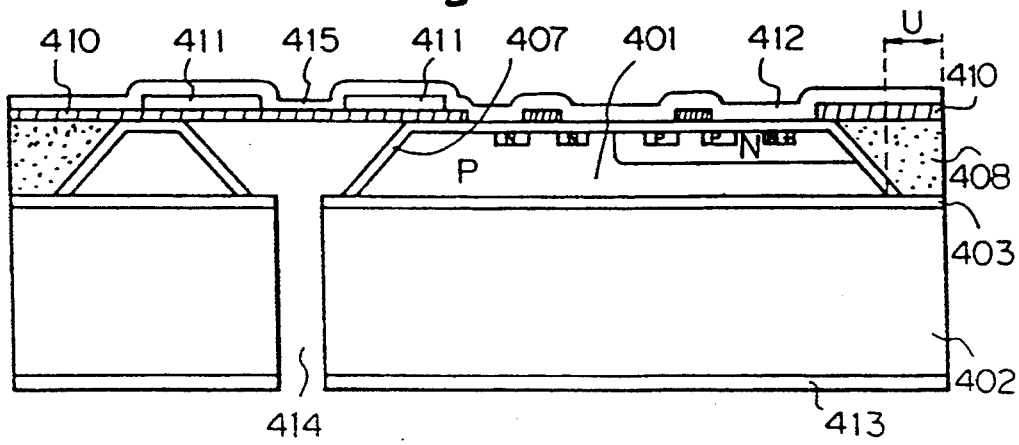

Then, as shown in FIG. 10(h), the $SiO_2$ film 403 in the aperture 414 is removed with hydrogen fluoride, and thereafter, the polycrystalline silicon 408 is removed by etching with an etchant of a KOH solution.

In this case, although the polycrystalline silicon 408 is completely removed because the etching is carried out isotropically, this etching does not affect other portions of the substrate because the portion in which the etching as mentioned above is carried out is surrounded by the $SiO_2$ film 403, the $SiO_2$ film 407 on the tapered portion, and the silicon nitride film 410.

As explained above, after the polycrystalline silicon 408 is removed, a diaphragm 415 of the pressure sensor is formed.

In this example, a predetermined distance U is formed between the outer peripheral side surface portion of the $SiO_2$ film 403 and the outer peripheral side surface portion of the island portion of the silicon semiconductor substrate 402 on which the CMOS circuitry 409 is provided, and further, the CMOS circuitry 409 and the piezoresistance layer 411 are completey covered by an insulated film 412, and thus the electrical isolation characterisitc with respect to an external portion can be maintained even when air or gas containing moisture or the like is introduced from the pressure introducing aperture 414.

As shown in this Example, the pressure sensor can be made very small and several pressure sensors can be mounted on one chip, whereby a pressure sensor having many functions can be provided without increasing production costs.

Further, in this embodiment, it is apparent more than an island of the semiconductor substrate (here, the substrate referred to is the silicon semiconductor substrate 402) on which a semiconductor device is formed, can exist, and a semiconductor device such as a power MOS or the like may be formed in the silicon semiconductor substrate 402.

Figure 10I:
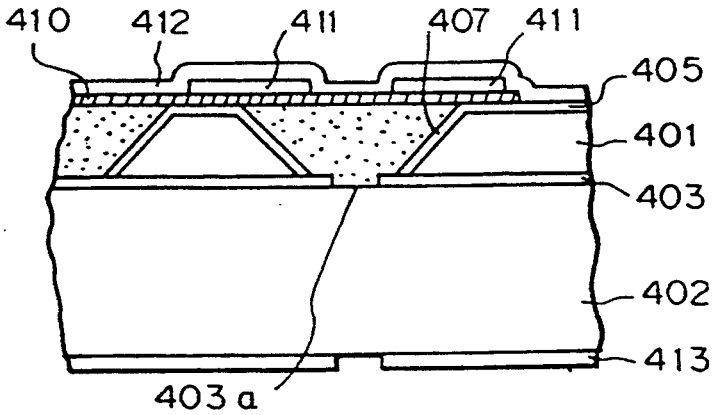
Figure 10J:
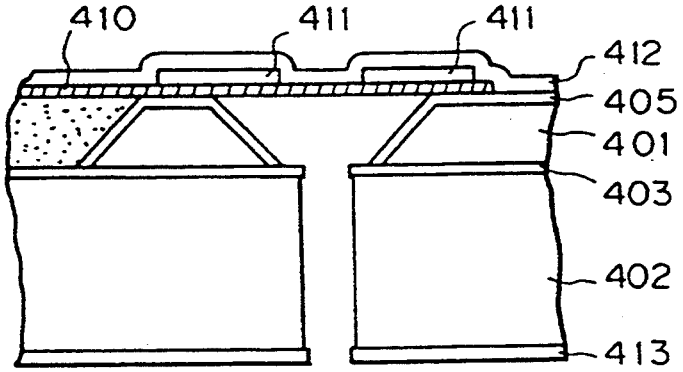

FIG. 10(i) shows a modification of the fifth embodiment, in which a portion 403a of the $SiO_2$ 403 corresponding to the portion on which a diaphragm is formed is removed before the diaphragm 415 is formed, by forming the aperture 414 and removing the polycrysatlline silicon 408, and thus the etching can be carried out in one step with a KOH solution as shown in FIG. 10(i).

Figure 10K:
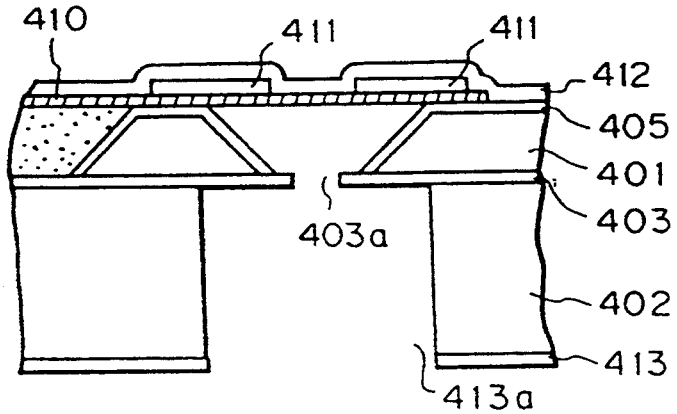

As shown in FIG. 10(k), when the size of the region 413a formed on the plasma nitride film 413 before the etching of the silicon semiconductor substrate 402 is larger than that of the region 403a formed on the $SiO_2$ film 403, the etching can be easily carried out because the flow of the etchant is improved.

Next, a sixth embodiment of the present invention will be explained hereunder with reference to FIGS. 11(a) to 11(h).

The steps shown in FIGS. 11(a) to 11(d) are the same as the steps shown in FIGS. 10(a) to 10(d) and 501 is a P type silicon semiconductor substrate, 502 is a silicon semiconductor substrate, 503 is an $SiO_2$ film, and 504 is an n-well region respecitvely.

Figure 11A:
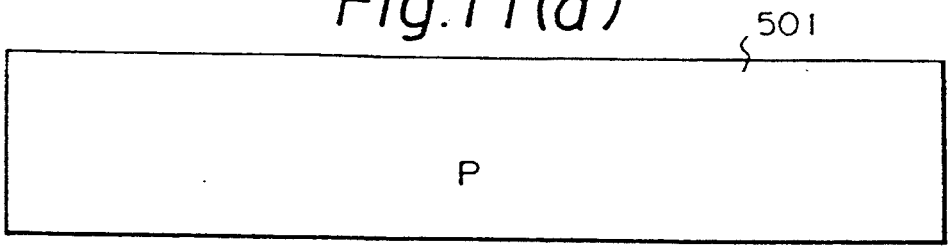
FIGS. 11(a) to 11(h) are cross sectional views of the process of manufacturing the semiconductor pressure sensor of a sixth embodiment of the present invention.
Figure 11B:
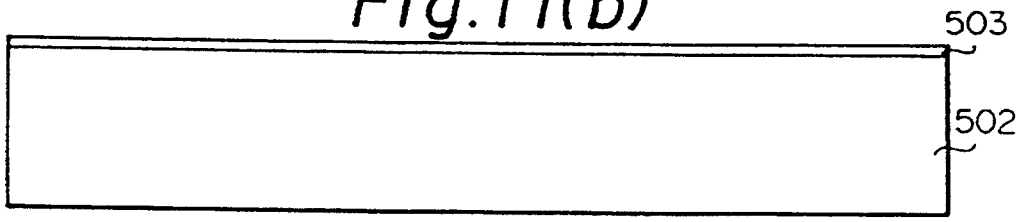
Figure 11C:
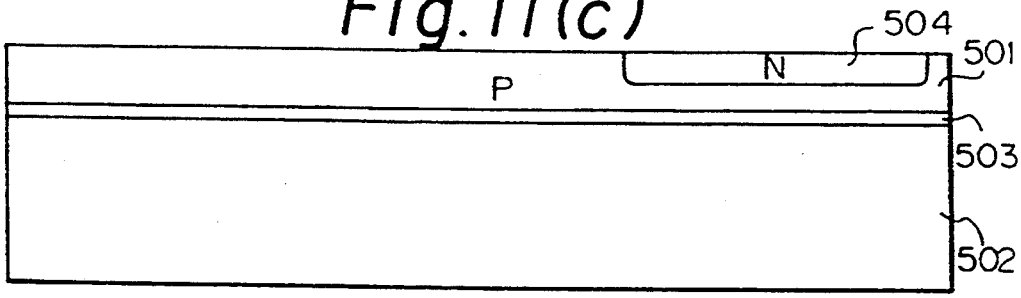
Figure 11D:
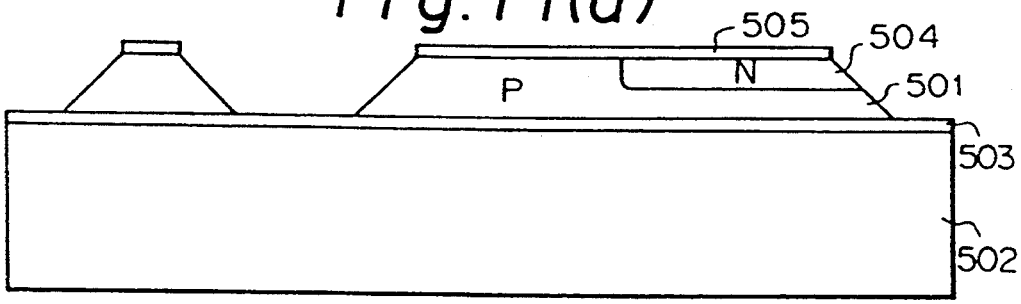
Figure 11E:
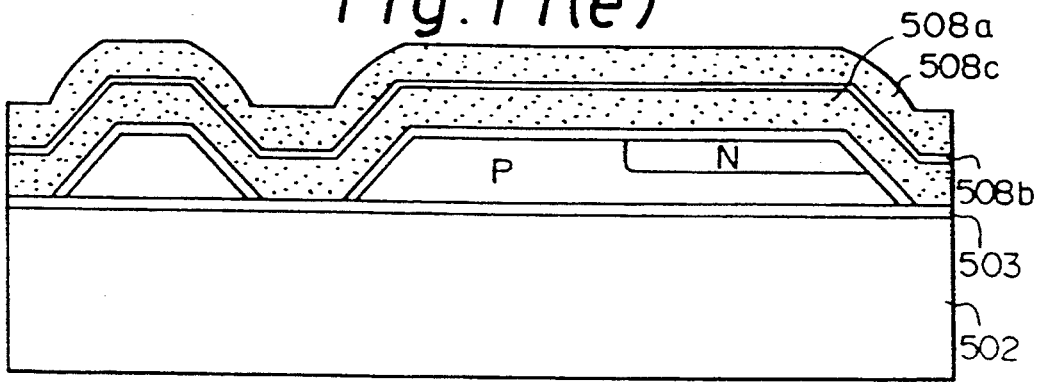
Figure 11F:
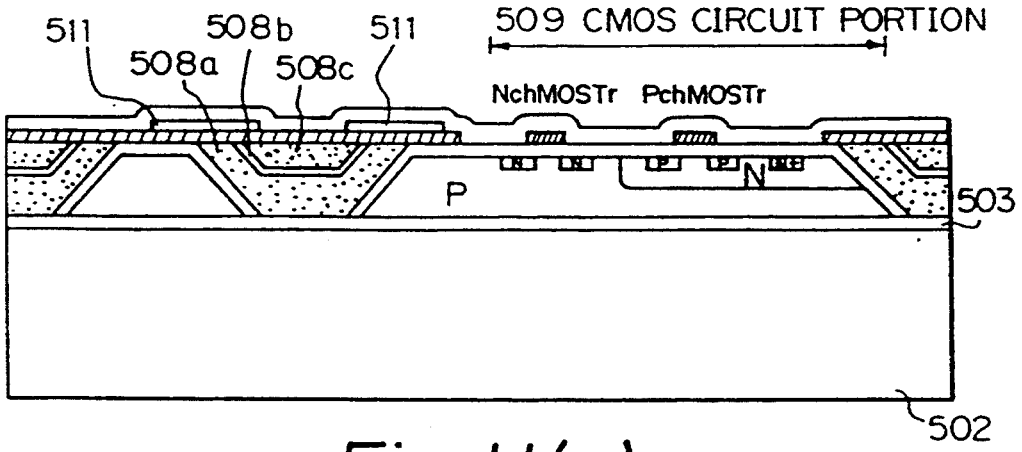

As shown in FIG. 11(e), after a first polycrystalline silicon layer 508a is formed, a $SiO_2$ film 508b having a thickness of 0.1 to 1 μm (or a silicon nitride film) is formed thereon, and then a second polycrystalline silicon layer 508c is formed on the surface of the $SiO_2$ film 508b.

Then successively, as in the fifth embodiment, the first and the second polycrystalline silicon layer 508a and 508c and the $SiO_2$ film 508b are simultaneously ground to smooth the surface thereof, and thus make surface of the polycrystalline silicon layer coplanar with the surface of an isolation film 505.

Figure 11G:
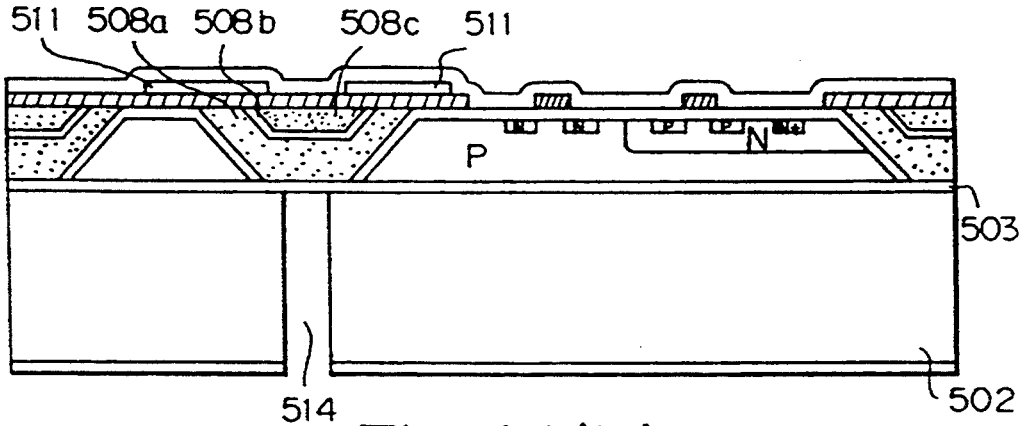
Figure 11H:
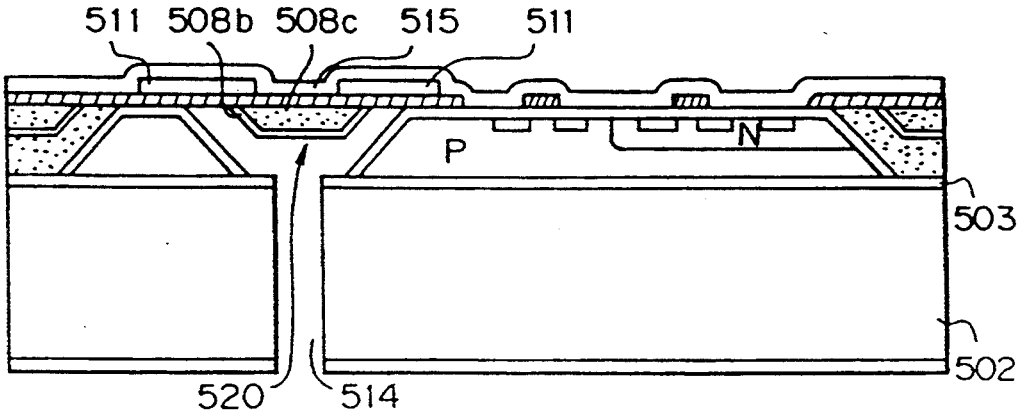

Thereafter a CMOSIC circuit 509 and a piezoresistance layer 511 or the like are formed thereon, and then a pressure introducing aperture 514 and a diaphragm 515 are formed as shown in FIGS. 11(g) and 11(h).

In this embodiment, since a thick portion 520 consisting of the second polycrystalline silicon layer 508c and the $SiO_2$ film layer 508b is formed in a central portion of the diaphragm 515, the stability of the output characteristic of the pressure sensor (for example, improvement of the linearity of the relationship between the pressure and the output) is improved.

As a modification of the above, the device can be used not only as a pressure sensor but also as a multipurpose sensor utilizing the thick portion thereof as mass portion of an acceleration sensor or vibration sensor.

The seventh embodiment of the present invention will be explained with refernece to FIG. 12.

In this embodiment, a piezoresistance layer 411 is formed on the surface of the silicon nitride film 410, instead of forming the polycrystalline silicon layer 408 on the inside surface of the concaved portion 4067b as in the fifth embodiment.

Figure 12:
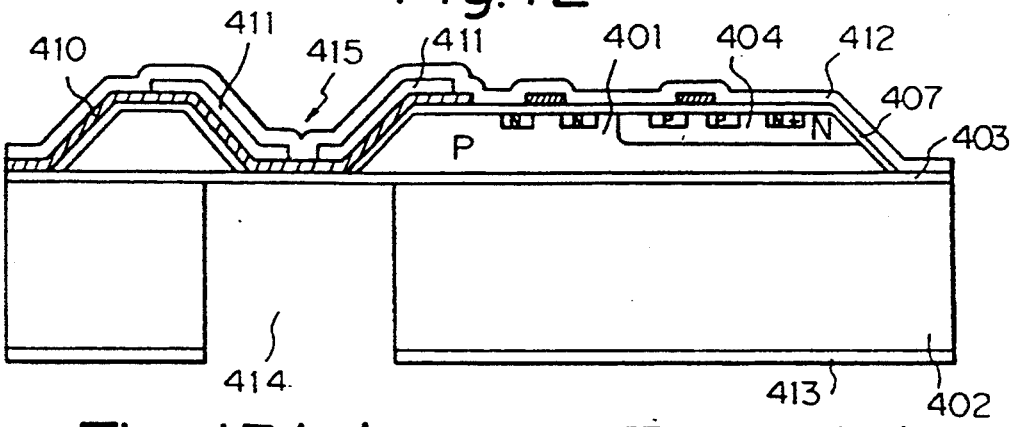
FIG. 12 is a cross sectional view of the semiconductor pressure sensor seventh embodiment of the present invention.

In FIG. 12, the same components as used in Example 5 are given the same reference numbers, and thus an explanation thereof is omitted.

An eight embodiments of the present will be explained with refernece to FIGS. 13(a) to 13(e).

This embodiment is intended to obtain a simple process for setting out "the predetermined distance" referred to in this invention, and the essential portion of this process is explained as follows.

Note that, in this embodiment, components such as a pressure introducing aperture corresponding to the cavity, a piezoresistance layer, semiconductor device, diaphragm or the like used in the embodiments 1 to 7, are used.

Figure 13A:
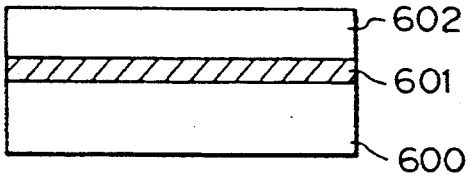
FIGS. 13(a) to 13(e) are cross sectional views of the process of manufacturing the semiconductor pressure sensor of an eighth embodiment of the present invention

First, as shown in FIG. 13(a), a silicon semiconductor substrate 600 and a silicon semiconductor substrate 602 are brought into contact with each other with an $SiO_2$ film 601 having a thickness of 0.5 to 2 μm therebetween, and then a semiconductor device (not shown) is formed in the silicon semiconductor substrate 602.

Figure 13B:
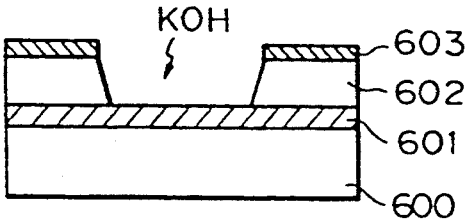

Then a plasma nitride film 603 is formed on the predetermined region of the silicon semiconductor substrate 602, to be used as a mask, and etching is carried out using the KOH etchant as shown in FIG. 13(b).

Figure 13C:
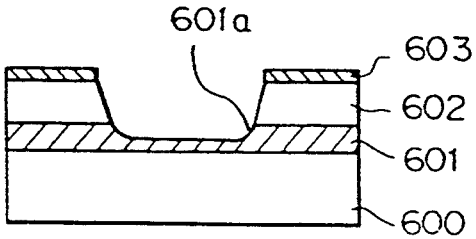
Figure 13D:
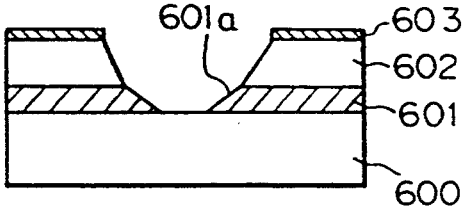

At this time, the silicon semiconductor substrate 602 is easily etched with the KOH etchant and the etching can proceed rapidly, but when the top end of the etched portion reaches the $SiO_2$ film 601, the etching will be expand in the lateral direction because of etching ratio of the $SiO_2$ the KOH etchant is extremeley slow, compared to that of the silicon, whereby the tapered portion 601a which is an inclined surface, is formed on the $SiO_2$ film 601 as shown in FIGS. 13(c) and 13(d).

Figure 13E:
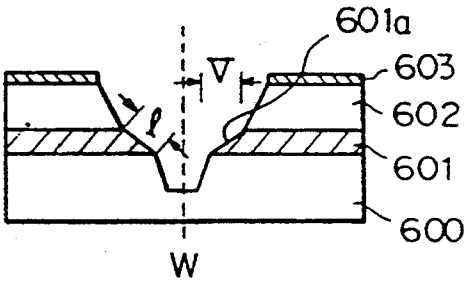

When the etching further proceeds and the top end portion of the etched portion arrives at the silicon semiconductor substrate 600, the silicon semiconductor substrate 600 is etched by using the tapered $SiO_2$ film 601a as a mask as shown in FIG. 13(e).

In accordance with experiments carried out by present inventors, when the etching with the etchant consisting of 33 wt % of KOH solution is applied to the silicon substrate having a configuration such as that shown in FIG. 13(b), i.e., already partly etched, and this silicon substrate comprises two silicon wafers having a (100) crystal face and used as the silicon semiconductor substrates 600 and 602, respectively, and having an $SiO_2$ film 601 having a thickness of 7000 Å therebetween, at a temperature of 82° C. for 105 minutes, the etching ratio of the $SiO_2$ is 70 Å/min and the ratio of the silicon having the (100) crystal fall is 170 Å/min, and thus the predetermined distance V as shown in FIG. 13(e) can be set to about 5 μm.

Note that the etchant used in this Example is not restricted to that explained above, and other etchants may be used if the etching ratio for $SiO_2$ is smaller than that for silicon, for example, an isotropic etchant which is a mixture of a plurality of acids such as hydrofluoric acid, nitric acid, and acetic and may be used.

According to this embodiment, the etching of the silicon semiconductor substrate 600 and 602 and the $SiO_2$ film 601 can be carried out simultaneoulsy, and the predetermined distance V can be arbitrarily controlled by changing the thickness of the $SiO_2$ film or the etching ratio of the silicon and $SiO_2$.

The cutting operation is then carried out along the dotted line W, after the step shown in FIG. 13(e) is completed, and at this time, no cracks appear in the film since the $SiO_2$ film is not damaged during the cutting operation.

Next, the setting of the predetermined distance as defined in this invention will be explained with reference to FIG. 14.

Figure 14A:
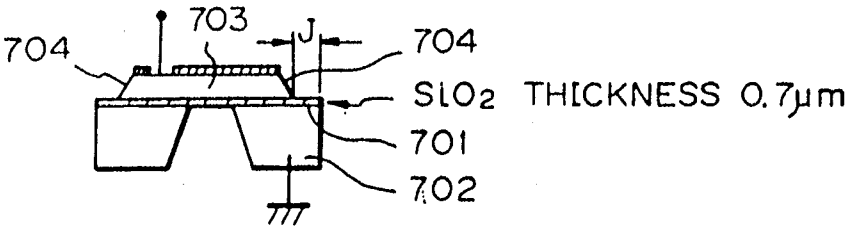
FIGS. 14(a) and 14(b) are cross sectional views of the construction for measuring a breakdown voltage, and a chart indicating the relationship between a distance and the breakdown voltage.
Figure 14B:
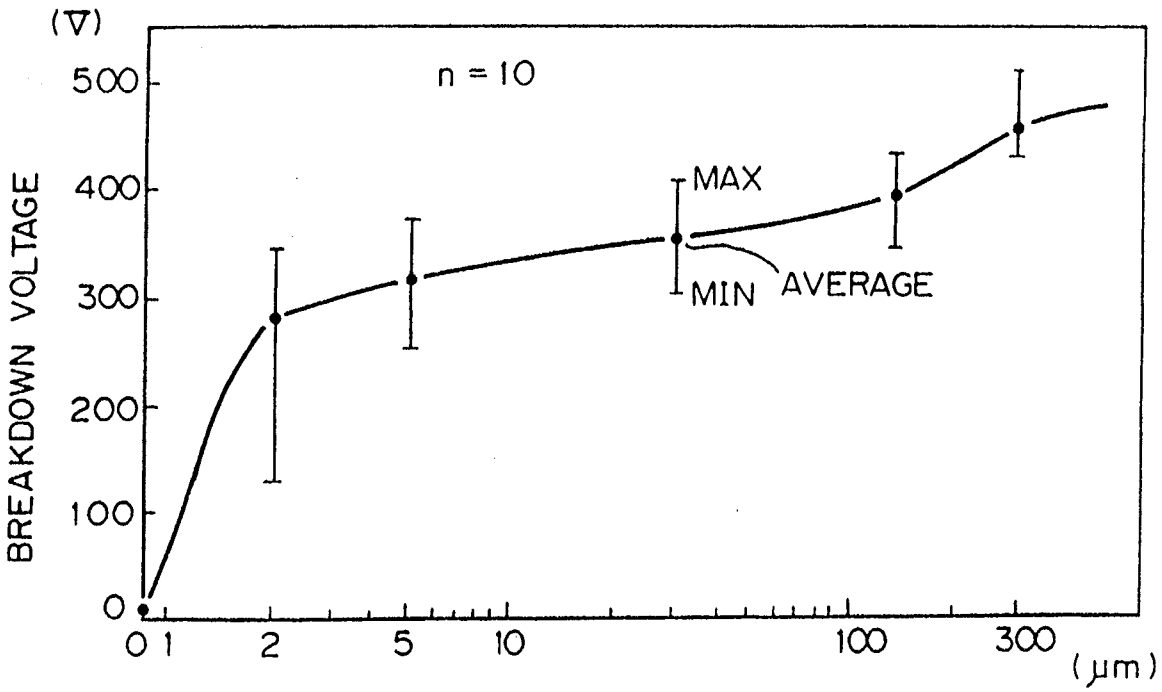

As shown in FIG. 14, several samples having a different predetermined distance J of the insulated substrate were produced, and the breakdown voltage thereof were measured.

The measurement was made by applying a required voltage to the samples, utilizing a "curve-tracer" (provided by TECHOTRONICS Co., Ltd. Type 577) and the voltage at which 100 μA of electric current suddenly flows was defined as the breakdown voltage. Note, at this time a spark discharge was observed on the $SiO_2$ film.

FIG. 14 is a chart in which data of the isolation breakdown voltages thus obtained are plotted with respect to the predetermined distance J. As apparent from FIG. 14, when J=0 μm, the isolation breakdown voltage is nearly zero, i.e., is completely short circuited, but when the predetermined distance J is more than 2 μm and the thickness of the $SiO_2$ film 701 is 0.7 μm, the average isolation breakdown voltage is 280 V, and thus it is determined that the silicon substrate 703 is isolated from the silicon substrate 702 by the isolated layer.

Further, the measuring is carried out under the condition in which the side surface 704 of the silicon layer 703 isexposed to air, as shown in FIG. 14, but when the side surface 704 is covered with an $SiO_2$ film or the like, then the isolation breakdown voltage is further lowered.

In the above embodiment of the present invention, the base for supporting a semiconductor pressure converting device of a semiconductor pressure sensor having a silicon semiconductor substrate, comprises a silicon which is the same material as the substrate or a "PYREX" (Trade Mark) glass having a similar thermal expansion coefficient as the silicon. When the base is made of silicon, however, there is no difference in the thermal expansion coefficient of the base and the sensor, and since a solder, an eutectic crystal of Au-Si, a glass having a low melting point or the like is used as an adhesive for the hermetic sealing between the base and the diaphragm, the thermal stress caused by this adhesive becomes a cause of a reduction of the detection accuracy of the pressure sensor.

When the "PYREX" (Trade Mark) glass is used as a base, however, there is no longer reduction of the accuracy of the pressure detection when an anodic bonding of the hermetical sealing is carried out and an adhesive is not used. Nevertheless, another problem arises in that the accuracy will be reduced by the influence of a thermal stress of about 1μ strain/100° C. caused by the difference of the coefficient of linear expansion of the silicon and the glass (about $1\times10^{-7}$/° C.)

On the other hand, a sodium boron compound, one of the components of the "PYREX" glass, generally has a hygroscopic characteristic, and therefore, when is used with the pressure sensor in a moist atmosphere, it absorbs the moisture to deform the base, and consequently, another problem arises in that the output characteristic of the sensor becomes unstable.

Therefore, in this invention, to overcome the problems explained above, a specific connecting construction between the pressure sensor and a base is described in detail hereunder.

Namely, a semiconductor pressure sensor is attached to a base with an isolation layer interposed therebetween this layer having an impurity containing region including mobile ions therein, and the impurity containing region is formed in the isolation layer such that there is no direct contact thereof with the atmosphere surrounding the pressure sensor.

According to this embodiment, thermal stress is reduced and moisture absorption by the connected portion thereof is prevented even when used in a moist atmosphere.

In this embodiment, any kind of pressure sensor can be used as the pressure sensing means but preferably the pressure sensor described in the above embodiments is used in this device.

Further, in this embodiment the isolation layer having an impurity containing region including mobile ions therein may be formed on one surface of the base on which the semiconductor pressure sensor is mounted, or on a bottom surface of the semiconductor pressure sensor.

The method of producing the semiconductor pressure sensor with a base, as described above, will be explained with reference to FIGS. 15 to 21.

FIGS. 15(a) to 15(i) are cross sectional views sequentially showing the steps of making the semiconductor pressure sensor of this embodiment.

Figure 15A:
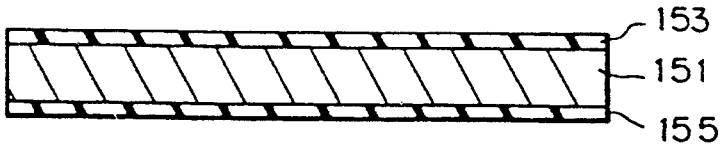
FIGS. 15(a) to 15(i) are the cross sectional views of the process of manufacturing the semiconductor pressure sensor of a ninth embodiment of the present invention.

First, in the step shown in FIG. 15(a), an n-type single crystal silicon substrate 151 having a (100) crystal face and a resistance of 2 to 10 Ω-cm is thermally-oxidized in a dry oxygen atmosphere to form thermally-oxidized films ($SiO_2$) 153 and 155 having a thickness of about 100 Å.

Figure 15B:
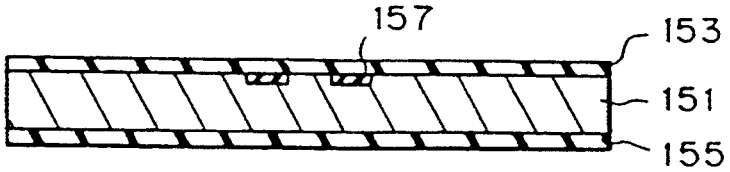

Next, in the step shown in FIG. 15(b), at least one piezoresistance layer 157 is formed by implanting ions such as boron or the like by an ion implanting method.

Figure 15C:
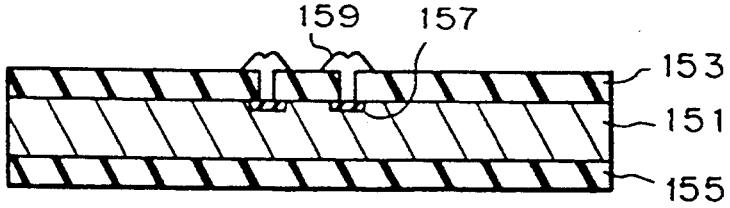

Then, in the step shown in FIG. 15(c), the thermal oxidation operation is further carried out on the surface of the thermally-oxidized film to bring the thermally-oxidized film ($SiO_2$) 153 and 155 to a thickness of 5000 Å to 1 μm, followed by forming a contact aperture on the thermally oxidized film to provide an Al wiring layer 159 thereat.

Figure 15D:
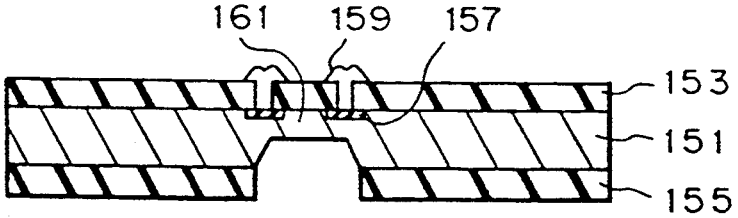

Thereafter, in the step shown in FIG. 15(d), after removing predetermined portions of the thermally oxidized film 155 by etching with a hydrofluoric acid (HF) solution, a diaphragm portion 161 is formed by etching the single crystal silicon substrate 151 by an anistropical etching method utilizing a KOH solution, using the remaining thermally-oxidized film 15 on the silicon substrate 151 as a mask.

Figure 15E:
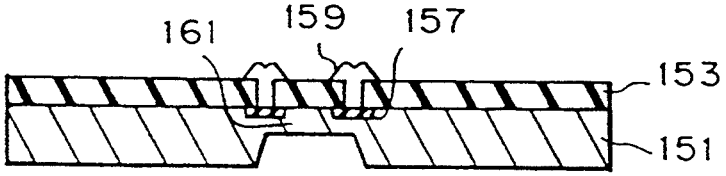

Subsequently, as shown in FIG. 15(e), the pressure transducing device is completed by removing the thermally-oxidized film 151 by etching with a hydrofluoric acid (HF) solution or the like.

Figure 15F:
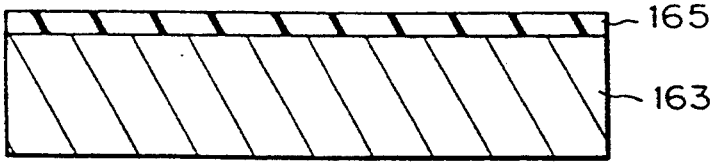

Then, in the step shown in FIG. 15(f), a surface of the n-type single crystal silicon substrate 163 having a (100) crystal face, a resistance of 2 to 10 Ω-cm, and a thickness of 2 mm to 5 mm, to be used as a base for a sensor, is polished to a mirror finish, and thereafter, a thermally-oxidized film ($SiO_2$) 165 having a thickness of 0.5 to 2 μm is formed as an isolation film, by a thermal oxidation method.

Figure 15G:
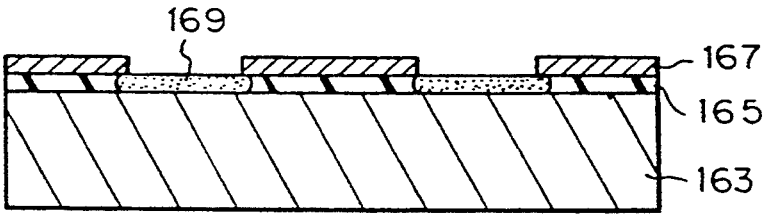

Then, in the step shown in FIG. 15(g), resist patterns 167 are formed in predetermined areas on the surface of the oxide film 165, utilizing a usual photolithographic method, and successively, the regions including impurities 169 are formed in the thermally oxidized film 165 by implanting $Na^+$ ion therein. (any kind of ions may be used in this process but as the ion to be implanted therein, $Na^+$, $K^+$, $Li^{30}$ or the like are preferably used.)

Figure 15H:
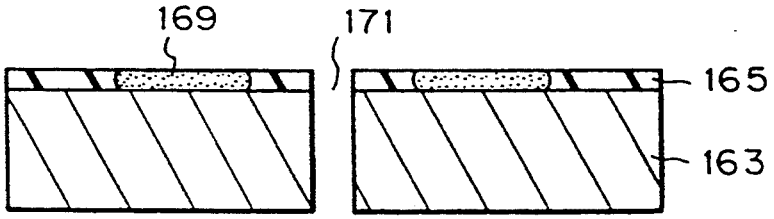

Next, in the step shown in FIG. 15(h), after the resists are removed, a pressure medium introducing aperture 171 penetrating the substrate and the oxide film is formed by ultrasonic processing or the like.

Figure 15I:
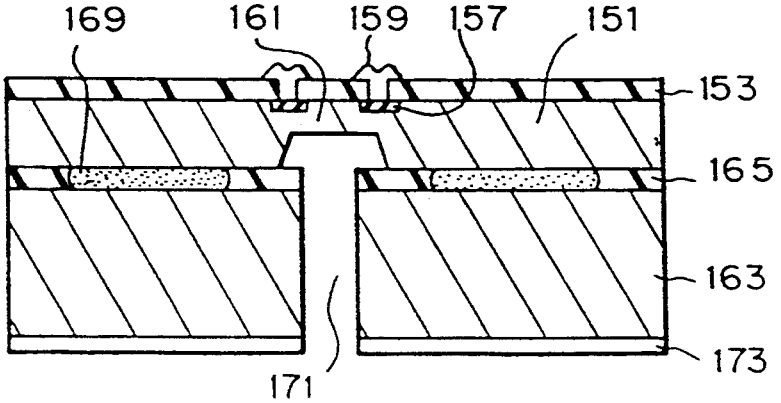

Then, as shown in FIG. 15(i), the pressure transducing device as shown in FIG. 15(e), and the base as shown in FIG. 15(h), are brought into contact with each other by a usual anodic bonding method.

Figure 21:
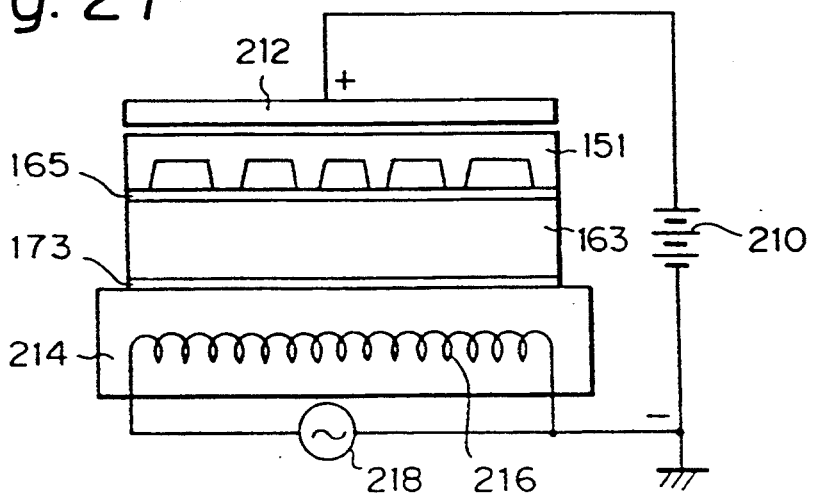
FIG. 21 is a view showing a method of bond anoding used in the present invention; and, FIG. 22 is a cross sectional view of a conventional semiconductor pressure sensor.

This anodic bonding method is carried out in such a way that, after both components are brought into contact with each other, an electric voltage is applied thereto so that the pressure transducing device is used as an anode as shown in FIG. 21, and both components are subjected to a thermal treatment by the heater 216 at a temperature of 300° C. to 500° C.

As shown in the FIG. 21, an electric source 210, an anode 212, a cathode 214, and an electric source for the heater 218 are provided, and further, a metallized layer 173 formed by a metal plating method, a vacuum deposition method or the like is provided on one surface of the silicon substrate 163 opposite to the surface thereof on which the thermally-oxidized film 165 is formed, to obtain an electrical conduction when the anoidic bonding is carried out.

Figure 16:
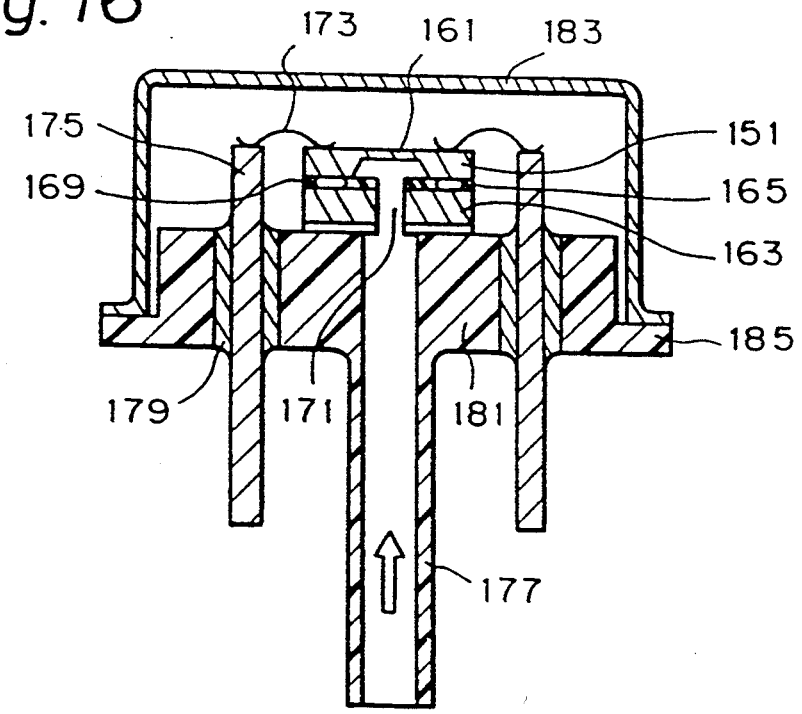
FIG. 16 is a cross sectional view showing one application of the pressure sensor of the present invention.

FIG. 16 is a cross sectional view of one form of application of the pressure sensor producing in accordance with this ninth embodiment.

In FIG. 16, four piezoresistance devices 157 (not shown) are provided at predetermined positions on the diaphragm 161 and are electrically connected to each other to form a full bridge connection, and further are electrically connected to the end portion of the hermetically sealed terminal 175 through the bonding wire 173 made of aluminum.

The base 163 is adhered at a predetermined position of a stem 181 of "Koval" (TRADE MARK) provided with a pipe for introducing pressure medium therein 177 and a hermetically sealed portion 179, by a metal plating method.

A cap 183 made of iron is also hermetically connected to the outer peripheral portion 185 of the stem 181, by a projection welding method, to form a pressure reference cell in a region surrounded by the cap 183 and the stem 181.

In this embodiment, when a pressure is applied to this sensor along the direction shown by an arrow, the diaphragm 161 is deformed to cause a variation in the resistance of the piezoresistance device 157, due to strain thereon, and an electric signal corresponding to that strain is output by the sensor through the hermetically seal terminal 175.

As explained above, in accordance with this embodiment, since both the pressure transducing device and the base thereof are made of the same material, such as silicon, and no adhesive is used therebetween, there is no difference in the coefficient of linear expansion of the pressure transducing device and the base, and thus a thermal strain caused by a such a difference will not be generated.

This effect can be obtained by connecting the silicon of both components utilizing the anodic bonding method, by implainting $Na^+$ ion therein without using an adhesive when connecting the silicon components to each other.

Further, in this embodiment, little thermal strain is generated, even when a variation in the temperature of, for example, about 100° C., occurs, because the thickness of the silicon base is thick, i.e., 2 to 5 mm, and the thickness of the thermal oxide film 165 is thin, e.g., 0.5 to 2 μm.

Moreover, in this embodiment, the silicon components are connected by the anodic bonding method, while forming the region 169 containing impurities therein by introducing ions into the thermally-oxidized film instead of connecting the silicon components with ad adhesive or "PYREX" glass, whereby the region 169 containing impurities therein is surrounded by the thermally-oxidized film 165, without including the purities therein, as shown in FIG. 15, and the region 169 containing impurities therein is no exposed to the atmosphere. Therefore, when this device is used in a moist atmosphere, the base is not deformed due to moisture absorption thereof, as when "PYREX" glass is used as the base.

Further, in this embodiment, the thermally-oxidized film 165 is formed on the surface of the silicon substrate 163, which has been given a mirror finish, by the thermal oxidation method, and therefore, the whole surface thereof is smooth and thus the contact between the surface of the thermally-oxidized film 165 not including impurities and the single crystal silicon substrate 151 can be maintained by the direct connection method to an extent such that the adhesive force obtained is weaker than the obtained by the anodic bonding method, but nevertheless is sufficient for actual usage.

This result is obtained by using a temperature of 300° to 500° C., when treating the device, and applying an electric voltage thereto during the anodic bonding.

Figure 17:
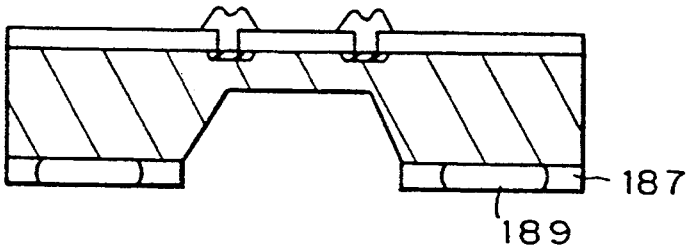
FIG. 17 and FIG. 18 are views showing modifications of the pressure sensor of the ninth embodiment of the present invention.
Figure 18:
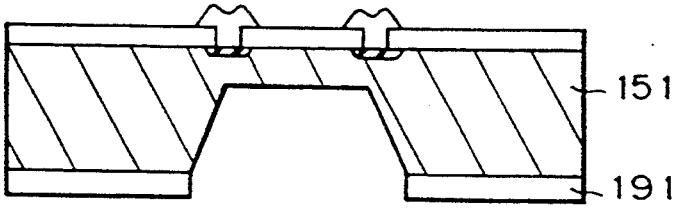
Figure 22:
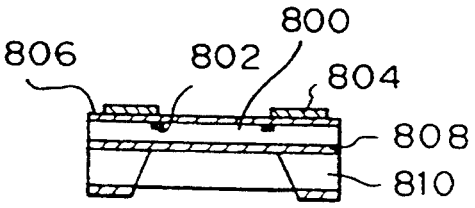
Fig. 22 PRIOR ART

In this embodiment, the $SiO_2$ layer 165 including the impurity contained region 169 is formed on the surface of the base, although as shown in FIG. 17, the same components can be brought into contact with each other by the anodic bonding method after the $SiO_2$ layer 187 including the impurity contained region 189 is formed on the surface of the pressure transducing device. At that time, the electric voltage can be applied by utilizing the pressure, transducing device as a cathode, and when this pressure sensor is to be used in a relatively dry atmosphere, the impurity containing region 191 may be formed on the bottom surface of the silicon substrate 151 by implanting the mobile ions into the entire surface thereof, as shown in FIG. 18. At that time, the impurity containing region 191 may be formed on the surface of the base.

Further, in this embodiment, $Na^+$ ions are implanted into the $SiO_2$ film, but another method such as a diffusion method or the like may be used, and moreover, by implanting impurities such as boron or the like therein, the ratio of the impurities in the impurity containing region may be adjusted to be the same as that of the "PYREX" glass having a similar coefficient of thermal expansion as the silicon.

The strain detecting device is not restricted only to the piezo resistance, and another device such as a MOS transistor or the like can be used.

In this embodiment, the thermally oxidized film 165 is formed by thermal oxidation, but it may be formed by a known CVD method, and further, such an isolation film is not restricted only to the $SiO_2$ film and another isolation film such as a nitride film or nitrided oxide film (formed by nitriding the thermal oxide film in $NH_2$ gas) may be used instead of the oxide film.

Next, the tenth embodiment of this invention will be explained with reference to FIG. 19.

In this embodiment, difference from the ninth embodiment, the pressure reference cell 193 is provided without forming the pressure introducing aperture in the substrate.

Accordingly, in this embodiment, the $SiO_2$ film 197 protecting the impurity containing region 195 from external moisture can be provided only on the outer peripheral portion of the device.

Figure 19:
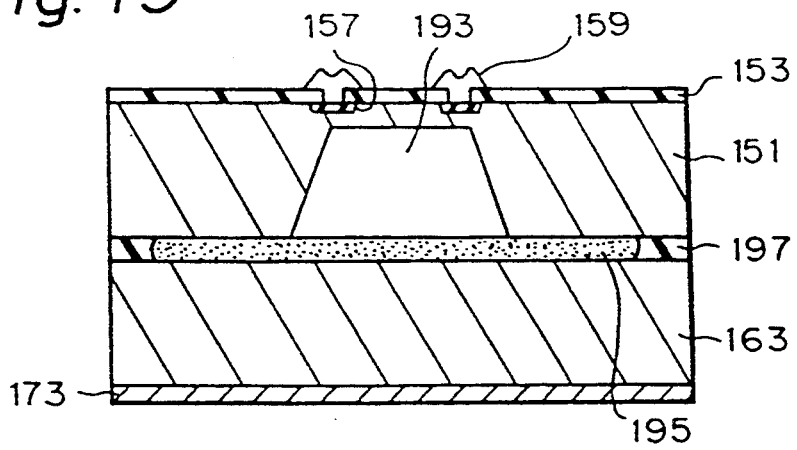
FIG. 19 is a cross sectional view of the semiconductor pressure sensor of the tenth embodiment of the present invention.
Figure 20:
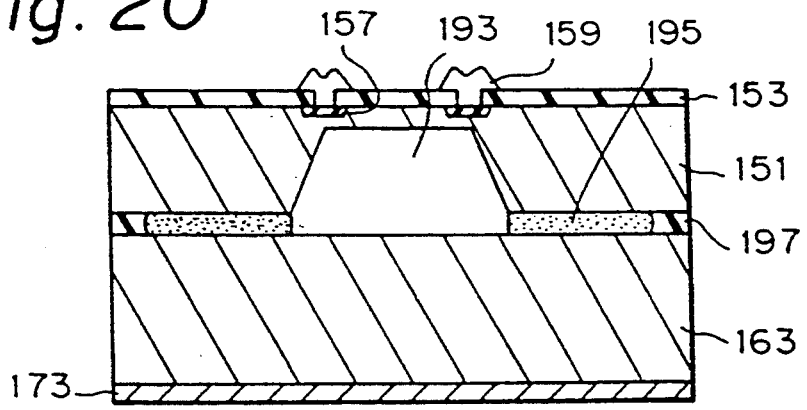
FIG. 20 is a cross sectional view showing a modification of the pressure sensor of the tenth embodiment of the present invention.

FIG. 20 shows a modification of the pressure sensor device sown in FIG. 19, in which the impurity containing region 195 is not formed on the surface of the substrate 163 and opposite to the pressure reference cell 193. In FIG. 20, the same components as used in FIG. 19 are given the same reference numbers.

In this modification, the pressure sensor in which the generation of thermal strain caused by the connecting portion between the semiconductor pressure transducing device and the base is reduced, and further, the contacting portion does not absorb moisture even used in a moist atmosphere, because the impurity containing region is formed such that is no contact between it and the substance surrounding the semiconductor pressure sensor.

Further, in this embodiment, although the impurity containing region is formed by introducing the mobile ions into the predetermined area on the main surface of the thermally-oxidized film of the silicon substrate, the impurity containing region can formed at any desired area of the main surface of the thermally-oxidized film of the silicon substrate.

We claim:

1. A semiconductor pressure sensor comprising:

a first semiconductor substrate including therein semiconductor means for electronically processing a pressure;

an isolation layer formed on one surface of said first semiconductor substrate, having a first surface attached to said one surface of said first semiconductor substrate and a second surface opposite said first surface, and having an outer peripheral side surface portion, a second semiconductor substrate formed on said second surface of said isolation layer, and provided with a portion into which a pressurized medium to be measured is introduced, said second semiconductor substrate being provided with an outer peripheral side surface portion, formed at a position apart from said outer peripheral side surface portion of said isolation layer by a predetermined length sufficient to remove electrical influences which effect said semiconductor means formed in said first semiconductor substrate, said electrical influences being from said outer peripheral side surface portion of said second semiconductor substrate, a strain, detecting potion formed at a position in said first semiconductor substrate opposite to said pressurized medium introducing portion in said second semiconductor substrate, for detecting a pressure of a pressurized medium to be measured and introduced into said pressurized medium introducing portion and producing an indication to said semiconductor means indicative thereof.

2. A semiconductor pressure sensor according to claim 1, wherein said strain detecting portion is constituted by a piezoresistance layer formed in said first semiconductor substrate, and said semiconductor means is formed between said piezoresistance layer and said outer peripheral side surface portion of said first semiconductor substrate.

3. A semiconductor pressure sensor according to claim 1, wherein a distance between said outer peripheral side surface portion of said isolation layer and said outer peripheral side surface portion of said second semiconductor region is larger than a thickness of said isolation layer.

4. A semiconductor pressure sensor according to claim 3, wherein said distance is obtained by forming the outer peripheral side surface of said isolation layer in a tapered configuration.

5. A semiconductor pressure sensor according to claim 1, wherein said pressurized medium introducing portion is extended directly to a rear part of said strain detecting portion and extends through said second and first semiconductor substrates.

6. A semiconductor pressure sensor according to claim 1, wherein said first semiconductor substrate is made of a single crystal semiconductor.

7. A semiconductor pressure sensor according to claim 1, wherein said peripheral side surface of said second semiconductor substrate is located at least 2 $\mu$m inside of an outermost part of said peripheral side surface of said isolation layer.

8. A semiconductor pressure sensor comprising:

a first semiconductor substrate having an outer peripheral side surface portion and provided with a portion into which a pressurized medium to be measured is introduced.

an isolation layer formed on one surface of said first semiconductor substrate, having a first surface attached to said one surface of said first semiconductor substrate and a second surface opposite said first surface, and having an outer peripheral side surface portion, a second semiconductor substrate formed on said second surface of said isolation layer and provided with a semiconductor structure for electrically processing a pressure detection, said second semiconductor substrate being provided with an outer peripheral side surface portion which is formed at a position apart from said outer peripheral side surface portion of said isolation layer by a predetermined length sufficient to remove electrical influences which affect said semiconductor structure formed in said second semiconductor substrate, which influences are through said outer peripheral side surface portion of said second semiconductor substrate and through said outer peripheral side surface portion of said isolation layer, and a strain detecting portion formed at a position in said second semiconductor substrate opposite to said pressurized medium introduced portion formed in said first semiconductor substrate for detecting a pressure of a pressurized medium to be measured and introduced into said pressurized medium introducing portion and for producing an indication thereof to said semiconductor structure.

9. A semiconductor pressure sensor according to claim 8, wherein said strain detecting portion is constituted by a piezoresistance layer formed in an vicinity of said semiconductor structure formed in said second semiconductor substrate, and said semiconductor structure is formed between said piezoresistance layer and said outer peripheral side surface portion of said second semiconductor substrate.

10. A semiconductor pressure sensor according to claim 9, wherein said outer peripheral side surface portion of said second semiconductor substrate is exposed to the atmosphere, and further comprising an insulating film, on an upper surface of said second semiconductor substrate opposite to the surface on which said isolation layer is formed.

11. A semiconductor pressure sensor according to claim 9, further comprising an isolating film covering said outer peripheral side surface portion of said second semiconductor substrate.

12. A semiconductor pressure sensor according to claim 8, wherein said semiconductor pressure sensor further comprises:

a diaphragm structure formed on said second semiconductor substrate and at a position opposite to said pressurized medium introducing portion, and wherein said pressurized medium introducing portion is formed by penetrating said first semiconductor substrate, said isolation layer and said second semiconductor substrate, to extend a tip portion thereof directly to a portion on which said diaphragm structure is located, and an inside surface of said pressurized medium introducing portion formed in said second semiconductor is covered with another isolating film, said strain detecting portion being formed on said portion on which said diaphragm structure is located, said diaphragm structure being provided thereon, and said semiconductor structure being formed between a portion on which said pressurized medium introducing portion is formed in said second semiconductor substrate and said outer peripheral side surface portion of said second semiconductor substrate.

13. A semiconductor pressure sensor, directly mounted on a device related to an engine of an automobile, for detecting a pressure of a medium to be measured, used in said device, wherein said pressure sensor comprises:

a housing provided on said device and including a pressurized medium introducing device therein for introducing a pressurized medium to be measured therein;

a first semiconductor substrate having upper and lower surfaces and an outer peripheral side surface portion extending between said upper and lower surfaces, and provided with a pressurized medium introducing portion, wherein said lower surface of said first semiconductor substrate is connected to said pressurized medium introducing device, whereby said pressurized medium introduced by said pressurized medium introducing device is introduced into said pressurized medium introducing portion;

a second semiconductor substrate having upper and lower surfaces and an outer peripheral side surface portion extended between said upper and lower surfaces and provided with a semiconductor structure for electronically processing a pressure detection;

a strain detecting portion formed in a position in said second semiconductor substrate opposite to said pressurized medium introducing portion formed in said first semiconductor substrate, and detecting a pressure of a pressurized medium to be measured and introduced into said pressurized medium introducing portion; and an isolating layer provided between said upper surface of said first semiconductor substrate and said lower surface of said second semiconductor substrate to serve as an electrical insulator, and having an outer peripheral side surface portion extending between a first surface coupled to said first semiconductor substrate and a second surface coupled to said second semiconductor substrate, wherein each location of the outer peripheral side surface portions of said isolation layer, said first semiconductor substrate and said second semiconductor substrate, is determined respectively so as to remove electrical influences which affect said semiconductor structure formed in said second semiconductor substrate, caused by influences [through] *from* said outer peripheral side surface portion of said [second] *first* semiconductor substrate and through said outer peripheral side surface portion of said isolation layer.

14. A semiconductor pressure sensor according to claim 13, wherein said device with relation to an engine is a surge tank, and said pressurized medium introducing device is a device for introducing a pressurized medium into said surge tank.

15. A semiconductor pressure sensor according to claim 14, wherein said pressurized medium introducing device is provided with means for preventing foreign particles introduced from said surge tank from entering said pressurized medium introducing portion formed in said first semiconductor substrate.

16. A semiconductor pressure sensor according to claim 14, wherein said outer peripheral side surface portion of said [second] *first* semiconductor substrate is formed at a position apart from said outer peripheral side surface portion of said isolation layer by a predetermined length sufficient to remove electrical influences which affect said semiconductor structure formed in said second semiconductor substrate from said outer peripheral side surface portion of said [second] *first* semiconductor substrate through said outer peripheral side surface portion of said isolation layer.

17. A semiconductor pressure sensor according to one of claims 1 to 8, wherein at least one of the outer peripheral side surfaces of said fist and said second semiconductor substrates is located inside of an outermost peripheral side surface of said isolation layer by said predetermined length.

18. A semiconductor pressure sensor according to claim 17, wherein said predetermined length is determined in such a way that a distance between said outer peripheral side surface portion of said first and second semiconductor substrates is a length exceeding a thickness of said isolation layer.

19. A semiconductor pressure sensor according to claim 17, wherein said outer peripheral side surface portion of said isolation layer is formed in a tapered configuration to form said predetermined length.

20. A semiconductor pressure sensor according to claim 17, wherein said outer peripheral side surface portion of any one of said first and second semiconductor substrates is located at least 2 $\mu$m inside said outermost peripheral side surface portion of said isolation layer.

21. A semiconductor pressure sensor according to claim 17, wherein said isolation layer comprises an impurity region including mobile ions therein and said impurity region thereof is arranged such that it is not in direct contact with the atmosphere introduced into the vicinity of the pressure sensor.

22. A semiconductor pressure sensor according to claim 12, further comprising a polycrystalline silicon layer provided on a rear surface of said strain detecting portion and in said pressurized medium introducing device.

* * * * *